United States Patent [19]
Yabe et al.

[11] Patent Number: 5,834,142
[45] Date of Patent: Nov. 10, 1998

[54] METHOD OF MANUFACTURING X-RAY MASK AND HEATING APPARATUS

[75] Inventors: Hideki Yabe; Kenji Marumoto; Sunao Aya; Koji Kise; Hiroaki Sumitani; Takashi Hifumi; Hiroshi Watanabe, all of Tokyo, Japan

[73] Assignee: Mitsubishi Denki Kabushiki Kaisha, Tokyo, Japan

[21] Appl. No.: 738,287

[22] Filed: Oct. 25, 1996

[30] Foreign Application Priority Data

Oct. 26, 1995 [JP] Japan ................................ 7-279194
Jun. 14, 1996 [JP] Japan ................................ 8-154322

[51] Int. Cl.⁶ .................................................. G03F 9/00
[52] U.S. Cl. .................................................. 430/5; 378/35
[58] Field of Search ........................... 430/5, 311, 313; 378/34, 35

[56] References Cited

U.S. PATENT DOCUMENTS

| | | | |
|---|---|---|---|
| 4,873,162 | 10/1989 | Yoshioka et al. | 430/5 |
| 5,132,186 | 7/1992 | Takeuchi et al. | 430/5 |
| 5,464,711 | 11/1995 | Mogab et al. | 430/5 |
| 5,496,667 | 3/1996 | Yabe et al. | 430/5 |
| 5,677,090 | 10/1997 | Marumoto et al. | 430/5 |

FOREIGN PATENT DOCUMENTS 7135157  5/1995  Japan .

OTHER PUBLICATIONS

Kenji Marumoto, et. al., "Total Evaluation of W–Ti Abosorber X–ray Mask", SPIE vol.2194, pp. 221–230 (Feb. 1994).
T. Shoki, et. al., "Amorphous Structured $Ta_4B$ Absorber on SiC Membrane for X–ray Mask", Digest of Papers Photomask, Japan '95, pp. 18–19 (Apr. 1995).
* Abstract and Summary Only.
Kenji Marumoto, et. al., "A Strategy For Highly Accurate X–ray Masks", Digest of Papers XEL'95, pp. M 6–2–1/2(Apr. 1995).

Primary Examiner—S. Rosasco

[57] ABSTRACT

The X-ray mask manufactured according to the present invention can solve a problem that the thin film stress of the X-ray absorber cannot be made to be zero although the mean thin film stress throughout the X-ray absorber can be made to be zero. The thin film stress distribution over the X-ray absorber 4 after the X-ray absorber 4 has been formed on a silicon substrate 1 is measured, and then inputs of electric power to heaters 9a, 9b and 9c of a hot plate 8 are changed so as to heat the X-ray absorber 4 to temperatures according to a specified temperature distribution with which the thin film stress throughout the X-ray absorber can be made to be zero.

18 Claims, 20 Drawing Sheets

METHOD OF MANUFACTURING X-RAY MASK AND HEATING APPARATUS

BACKGROUND OF THE INVENTION

1. Field of the Invention

The present invention relates to a method of manufacturing an X-ray mask which is capable of making stress of an X-ray mask for use in X-ray lithography to be zero throughout the X-ray mask so as to pattern the X-ray mask with a required positional accuracy, and to a heating apparatus for heating the X-ray mask.

2. Related Background Art

FIG. 33 is a cross sectional view showing steps of a conventional method of manufacturing an X-ray mask disclosed in, for example, Japanese Patent Application No. 5-138104. Referring to FIG. 33, reference numeral 1 represents a silicon substrate, 2 represents a membrane (synonym with X-ray permeable substrate) formed on the silicon substrate 1, having a thickness of 1 $\mu$m to 2 $\mu$m and made of light elements, 3 represents a reflection preventive film formed on the membrane 2 and made of, for example, an indium tin oxide, 4 represents an X-ray absorber formed on the reflection preventive film 3 and made of a tungsten-titanium film, 5 represents a resist and 6 represents a support ring having a bonding adhesive 7 for bonding and supporting the silicon substrate 1.

A method of manufacturing an X-ray mask having the foregoing structure will now be described. Initially, the membrane 2 is formed on the silicon substrate 1 [see FIG. 33A]. Then, a portion of the silicon substrate 1 is removed (etched back) [see FIG. 33B]. Then, the reflection preventive film 3 is applied to the membrane 2, followed by being baked so as to be formed into a film [see FIG. 33C]. Then, the X-ray absorber 4 is formed on the reflection preventive film 3 by, for example, a sputtering method. The mean membrane stress of the thus-formed X-ray absorber 4 is measured to determine temperatures with which the mean stress can be made to be zero. Then, annealing is performed uniformly in, for example, an oven, at 250° C. to adjust the mean thin film stress of the X-ray absorber 4 to be zero [see FIG. 33D].

Then, the resist 5 is applied, and then baking is performed at, for example, 180° C. [see FIG. 33E]. Then, the silicon substrate 1 is bonded to the support ring 6 with the bonding adhesive 7 [see FIG. 33F]. Then, electron beam drawing or development is performed to pattern the resist 5. The patterned resist 5 is used as a mask when the X-ray absorber 4 is dry-etched so that the X-ray absorber 4 is patterned. Then, the resist 5 is removed so that the X-ray mask is formed [see FIG. 33G]. Note that the process for etching back the silicon substrate 1 and the process for bonding the silicon substrate 1 to the support ring 6 are not always performed in the foregoing sequential order.

The conventional method has been arranged such that the mean thin film stress of the X-ray absorber 4 is adjusted to be zero by changing the annealing temperature after the X-ray absorber 4 has been formed. A problem occurring when the film stress is not adjusted as described above will now be described with reference to FIG. 34. An assumption as shown in FIG. 34A is performed that the size of the window region of the silicon substrate 1 is 30 mm×30 mm and the stress of the X-ray absorber 4 at a position corresponding to the window region of the silicon substrate 1 is 10 MPa because no adjustment has been performed, as shown in FIG. 34B. If a 15 nm×15 nm region of the X-ray absorber 4 is patterned relative to the center of the window region of the silicon substrate 1 as shown in FIG. 34A, the stress of 10 MPa of the X-ray absorber 4 results in patterning of the X-ray absorber 4 being shifted for 15 nm from the center of the membrane 2. Thus, there arises a problem in that the X-ray absorber 4 cannot be patterned as required. The shift takes place outward when the stress is tensile stress, while the same takes place inward when the stress is compressive stress.

Accordingly, the X-ray absorber 4 has been heated by annealing to make the mean thin film stress of the X-ray absorber 4 to be zero so that unintentional shift occurring in patterning has been prevented.

The conventional method of manufacturing an X-ray mask has been performed as described above to prevent the patterning shift of the X-ray absorber 4 of a type shown in FIG. 34. However, since the actual distribution of the thin film stresses of the X-ray absorber 4 is not uniform, a problem as shown in FIG. 35 arises.

FIG. 35A shows a state where a 15 nm×15 nm region of the X-ray absorber 4 in a 30 mm×30 mm window region of the silicon substrate 1 has been patterned similarly to FIG. 34A. FIG. 35B is a graph showing stress distribution over the X-ray absorber 4 realized after the X-ray absorber 4 has been heated by annealing and, thus, the mean thin film stress of the X-ray absorber 4 has been made to be zero. Although the mean film stress of the X-ray absorber 4 has been made to be zero as shown in FIG. 35B, stress has not been zero throughout the X-ray absorber 4 in actual. Therefore, patterning of the X-ray absorber 4 shown in FIG. 35A is shifted similarly to the case shown in FIG. 34. Thus, there arises a problem in that the X-ray absorber 4 cannot be patterned as required.

In case of the X-ray absorber as shown in FIG. 35B, although the mean stress is equal to 0, the stress distribution in the thickness direction changes from −10 MPa to +10 MPa, so that the X-ray absorber has various stress not equal to zero at many points in the thickness direction. Therefore, when an overetching process is applied to where the mean stress is equal to zero, the mean stress moves to the compress stress side and becomes a total of several MPa. Therefore, patterning of the X-ray absorber 4 shown in FIG. 35A is shifted similarly to the case shown in FIG. 34. Thus, there arises a problem in that the X-ray absorber 4 cannot be patterned as required.

SUMMARY OF THE INVENTION

To solve the foregoing problems, a first object of the present invention is to provide a method of manufacturing an X-ray mask capable of making the thin film stress of an X-ray absorber to be zero throughout the X-ray absorber so that required patterning is obtained.

A second object of the present invention is to provide a heating apparatus for carrying out the method.

A third object of the present invention is to provide a method of manufacturing an X-ray mask having a stable thin film stress distribution not changed by overetching and so on.

According to a first aspect of the present invention, there is provided a method of manufacturing an X-ray mask comprising steps of: forming an X-ray absorber on a substrate, and then annealing said X-ray absorber by heating in accordance with a specified temperature distribution determined on the basis of a measured thin film stress distribution with which the measured thin film stress throughout said X-ray absorber can be made to be zero.

In case of applying a number of said annealing to the X-ray absorber, said X-ray absorber may be uniformly heated before the final annealing, and the final annealing is performed in accordance with a specified temperature distribution based on a measured thin film stress distribution, with which the measured thin film stress throughout said X-ray absorber can be made to be zero.

Although the specified temperature distribution may be determined on the basis of the thin film stress distribution measured before annealing, the specified temperature distribution can be determined in advance from a thin film stress distribution without annealing measured in advance before forming an X-ray absorber.

In a preferred embodiment, said step of forming an X-ray absorber may be carried out while rotating a substrate to make thin film stress distribution over said X-ray absorber to be axial symmetric with respect to a rotational axis of said substrate because the specified temperature distribution will be axial symmetric, resulting in easy operation.

Said X-ray absorber before annealing may be in a state of amorphus because of easy adjustment of a specified temperature distribution for annealing with which the measured thin film stress throughout said X-ray absorber can be made to be zero.

To manufacture an X-ray absorber, there are proposed the following five kinds of heating apparatuses for annealing an X-ray absorber formed on a substrate.

The first preferred apparatus comprises:

a hot plate for annealing said X-ray absorber with uniform temperatures through a gap distribution between said X-ray absorber and said hot plate, wherein a means for adjusting said gap distribution so as to get a specified temperature distribution with which a measured thin film stress throughout said X-ray absorber formed can be made to be zero.

The second preferred apparatus comprises:

an oven for heating said X-ray absorber to a uniform temperature; and a heat sink capable of absorbing and radiating heat and disposed at a position corresponding to a measured thin film stress distribution over said X-ray absorber formed, so that portions of said X-ray absorber are heated to respective temperatures according to a specified temperature distribution with which said measured thin film stress throughout said X-ray absorber formed can be made to be zero.

The third preferred apparatus comprises:

an oven for heating said X-ray absorber to a uniform temperature; and a cooling-gas discharge means for cooling said X-ray absorber corresponding to a measured thin film stress distribution over said X-ray absorber so that portions of said X-ray absorber are heated to respective temperatures according to a specified temperature distribution with which said measured thin film stress throughout said X-ray absorber formed can be made to be zero.

The fourth preferred apparatus comprises:

a heating lamp for heating said X-ray absorber to a uniform temperature; and a mask for intercepting radiant heat from said heating lamp, said mask being patterned to correspond to a measured thin film stress distribution over said X-ray absorber so that portions of said X-ray absorber are heated to respective temperatures according to a specified temperature distribution with which said measured thin film stress throughout said X-ray absorber formed can be made to be zero.

The fifth preferred apparatus comprises:

a laser output means for heating said X-ray absorber; and a means for moving said laser output means while radiating a laser from said laser output means so as to correspond to a measured thin film stress distribution over said X-ray absorber so that portions of said X-ray absorber are heated to respective temperatures according to a specified temperature distribution with which said measured thin film stress throughout said X-ray absorber formed can be made to be zero.

Instead of annealing, ion doping may be applied to the X-ray absorber to make said measured thin film stress throughout said X-ray absorber to be zero. Therefore, according to the present invention, there is a method of manufacturing an X-ray mask comprising steps of: forming an X-ray absorber on a substrate, and then doping ions into said X-ray absorber in accordance with a specified ion injection distribution based on a measured thin film stress distribution to make the measured thin film stress at respective parts throughout said X-ray absorber substantially zero.

In the ion doping process, the ion to be doped may be selected from the group consisting of Ar ion, Si ion, Ne ion, Kr ion and Xe ion.

In case of forming thin films of X-ray absorber according to plural forming conditions, each thin film stress distribution should be compensated each other so as to make the thin film stress to be substantially zero by adjusting the forming conditions. Therefore, there can be provided an X-ray absorber having substantially zero stress at all the point and thus a predetermined patterning. The preferred method has additionally a step of heating the X-ray absorber uniformly by annealing in every thin film forming step, because there can be obtained a stable X-ray absorber. Alternatively, the stable X-ray absorber can be obtained by heating the X-ray absorber uniformly by annealing in the final thin film forming step.

In case of said substrate having a flat surface, there may be applied to said substrate a step of making a surface area having a smaller thin film stress more uneven than a surface having a larger thin film stress, according to the thin film stress distribution measured in advance, because it is easy to manufacture an X-ray absorber on a substrate provided with the thin film stress of zero at all the positions over the X-ray absorber.

According to a third aspect of the present invention in order to provide an X-ray absorber having a uniform stress in the thickness direction, there is provided a method of manufacturing an X-ray mask, comprising steps of: providing conditions for forming a thin film in a manner to decrease a pressure for forming the thin film among said conditions step by step so as to make the stress in the thickness direction substantially uniform, and forming thin films on a substrate according to said determined conditions In case of forming thin films in turn on a substrate according to the same forming condition, the method should be carried out by a number of thin film forming steps, and said X-ray absorber should be annealed by uniformly heating after every thin film forming steps so as to make the maximum thin film stress of the X-ray absorber substantially zero. Therefore, there can be obtained an X-ray absorber having a uniform stress in the thickness direction, so that change of the mean stress in the thickness direction can be prevented due to overetching of the X-ray absorber.

DETAILED DESCRIPTION OF THE PREFERRED EMBODIMENTS

Preferred embodiments of the present invention will now be described with reference to the drawings.

First Embodiment

Figure 1:
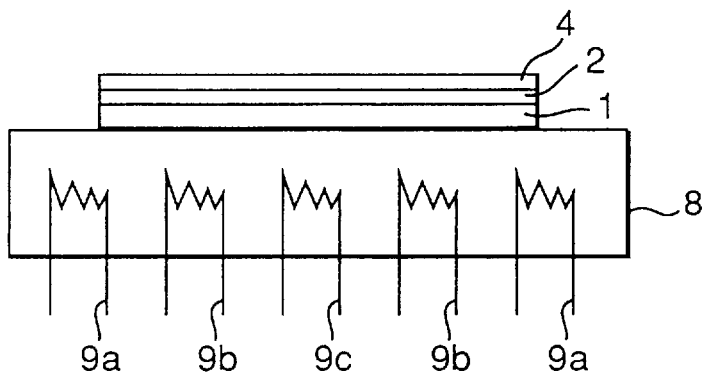
FIG. 1 is a cross sectional view showing a method of manufacturing an X-ray mask and a heating apparatus according to a first embodiment of the present invention.

FIG. 1 is a cross sectional view showing a method of manufacturing an X-ray mask and a heating apparatus according to a first embodiment of the present invention. Referring to FIG. 1, similar elements to those of the conventional structures are given the same reference numerals and the similar elements are omitted from description. Reference numeral 8 represents a circular hot plate serving as the heating apparatus for heating the X-ray absorber 4, the hot plate 8 including heaters 9a, 9b and 9c disposed annularly. Thus, axial symmetric temperature distribution is realized on the hot plate 8. By changing input of electric power to each of the heaters 9a, 9b and 9c, the radial temperature distribution over the hot plate 8 can be changed.

The method of manufacturing an X-ray mask having the foregoing structure according to the first embodiment will now be described. Initially, the thin membrane 2 is formed on the silicon substrate 1 by, for example, a CVD (abbreviation of chemical vapor deposition) method similarly to the conventional method. Then, an X-ray absorber 4 made of a tungsten-titanium film is formed on the membrane 2. The X-ray absorber 4 is formed by sputtering in a state where the silicon substrate 1 is rotated under condition that the pressure is 8.5 mTorr, the ratio of Ar gas and nitrogen gas is 93/7 and the supplied electric power is 650 W. Note that the reflection preventive film 3 described in the Related Background Art is omitted from description.

Figure 2A:
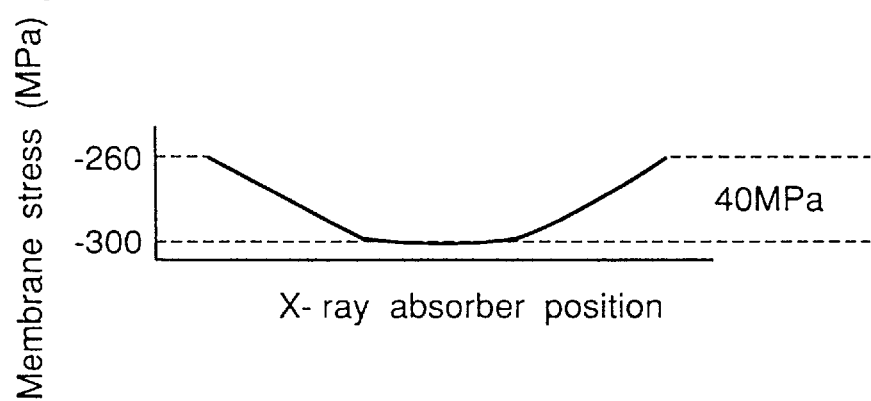
FIGS. 2A and 2B are graphs showing a thin film stress distribution and a specified temperature distribution for the X-ray absorber according to the first embodiment of the present invention.

The X-ray absorber 4 formed under the foregoing condition has an amorphous structure in which thin film stress of the X-ray absorber 4 is generated in a portion in which compressive stress is generated. Since the X-ray absorber 4 is formed in the state where the silicon substrate 1 is rotated, axial symmetric thin film stress distribution is realized on the X-ray absorber 4. Measurement of the thin film stress distribution over the X-ray absorber 4 results in, for example, as shown in FIG. 2A, thin film stress being distributed symmetrically with respect to the center of the X-ray absorber 4 such that the thin film stress distributes from −260 MPa to −300 MPa in the portion in which the compressive stress is generated (where magnitudes of compressive stresses are expressed by minus values). Note that the thin film stress distribution over the X-ray absorber 4 can easily be obtained such that warp of the X-ray absorber 4 is measured and then the warp is second-order differentiated followed by multiplying a required coefficient.

Figure 2B:
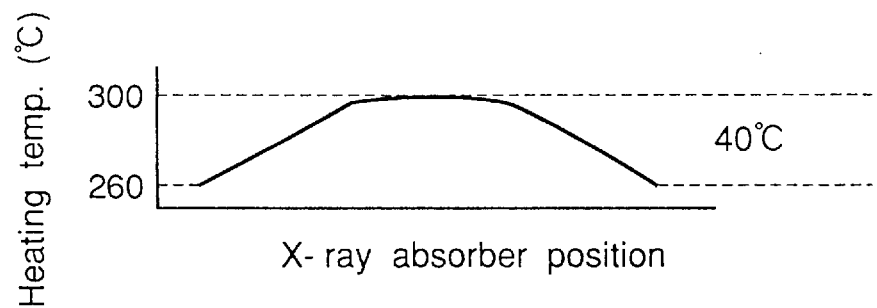

Then, a specified temperature distribution is obtained with which the thin film stress of the X-ray absorber 4 can be made to be zero throughout the X-ray absorber 4. Since heating by 1° C. is required to raise each MPa for example, a specific temperature distribution corresponding to the thin film stress distribution over the X-ray absorber 4 as shown in FIG. 2B is required such that the temperature is distributed from 260° C. to 300° C. The method of setting the temperature corresponding to the stress was available by making a reference to, for example, Proceeding of SPIE, 1994, vol. 2194, pp. 221 to 229.

Then, input of electric power to each of the heaters 9a, 9b and 9c is adjusted to realize the specified temperature distribution for the hot plate 8 shown in FIG. 2B. Then, the silicon substrate 1 is placed on the hot plate 8 so that the X-ray absorber 4 is heated by annealing in accordance with the specified temperature distribution so as to make the thin film stress of the X-ray absorber 4 to be zero throughout the X-ray absorber 4.

Then, similarly to the conventional method, a portion of the silicon substrate 1 is removed (etched back) though the process is omitted from illustration. Then, the resist is applied, and then baking at, for example, 180° C. is performed. Then, the silicon substrate 1 is bonded to the oven by a bonding adhesive. Then, the resist is patterned by electron beam drawing or development. The patterned resist is used as a mask when the X-ray absorber 4 is dry-etched to pattern the X-ray absorber 4, and the resist is removed so that the X-ray mask is formed.

The method of manufacturing an X-ray mask according to a first embodiment of the present invention is structured as described above such that the thin film stress distribution over the X-ray absorber 4 is measured after the X-ray absorber 4 has been formed; and the X-ray absorber 4 is heated by annealing on the hot plate 8, the temperature distribution of which is able to make the thin film stress to be zero throughout the X-ray absorber 4, so that the thin film stress is made to be zero throughout the X-ray absorber 4.

Therefore, shift of the patterned X-ray absorber taking place due to thin film stress can be prevented so that an X-ray mask patterned into a predetermined shape can be obtained. As a matter of course, another specified temperature distribution except that shown in FIG. 2B can easily be set by changing the input of electric power to each of the heaters 9a, 9b and 9c.

Since the X-ray absorber 4 is formed in a state where the silicon substrate 1 is rotated, the thin film stress distribution over the X-ray absorber 4 is made to be axial symmetry. Therefore, the specified temperature distribution may be set to be the axial symmetric distribution. Therefore, the specified temperature distribution can further easily be determined.

The reason why the amorphous structure X-ray absorber 4 is employed in the first embodiment will now be described. A structure except the amorphous structure is exemplified by a columnar structure. If the sputtering pressure is made to be higher than that when the amorphous structure is obtained, the columnar structure can be obtained. Then, the amorphous structure and the columnar structure are compared to each other to describe the advantage of the amorphous structure.

The amorphous structure has advantages that the surface is flat and smooth, an excellent edge quality can be realized after etching has been performed, the stress is stable in the air and a linear relationship between temperatures and stresses can be held. In particular, the advantage described finally, that is, the advantage that the linear relationship between temperatures and stresses can be held enables the adjustment of the thin film stress of the X-ray absorber 4 with the annealing temperature to be performed reliably.

Figure 3:
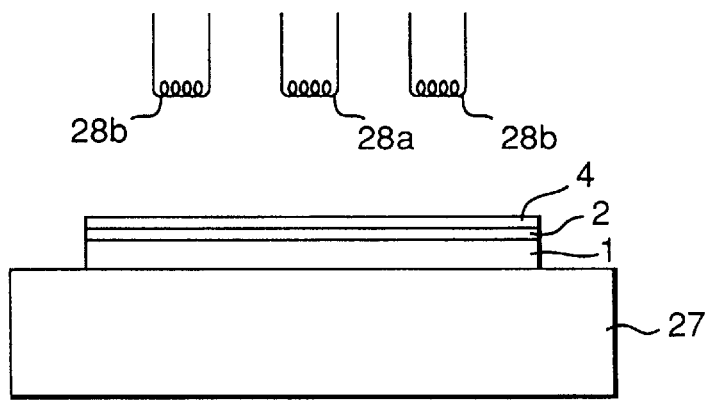
FIG. 3 is a cross sectional view showing a method of manufacturing an X-ray mask and a heating apparatus according to a second embodiment of the present invention.

Although the first embodiment has each heaters 9a, 9b and 9c in the hot plate 8, so that a specified temperature distribution can be obtained, the present invention is not limited to this embodiment. As shown in FIG. 3, if a silicon substrate 1 is placed on a support 27 and each heaters 28a, 28b such as filament heater is positioned above the X-ray absorber 4 so as to make the X-ray absorber have the specified temperature distribution, an advantage similar to that obtainable from the first embodiment can be realized.

Other embodiments of the heating apparatus for obtaining a specified temperature distribution corresponding to the thin film stress distribution over the X-ray absorber will now be described.

Second Embodiment

Figure 4:
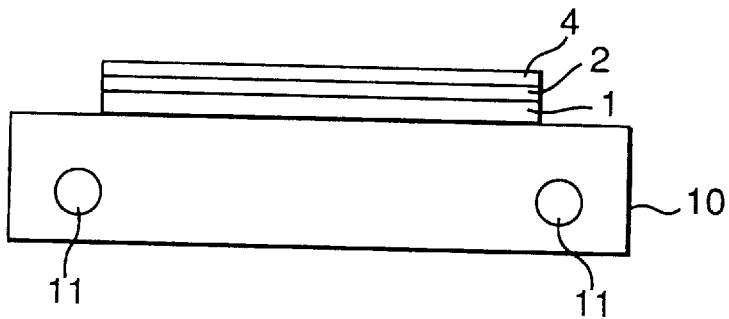
FIG. 4 is a cross sectional view showing the method of manufacturing the X-ray mask and the heating apparatus according to the second embodiment of the present invention.

Although the first embodiment has the structure such that the specified temperature distribution is set by changing the input of electric power to each of the coils 9a, 9b and 9c of the hot plate 8, the present invention is not limited to this. For example, another structure shown in, for example, FIG. 4, may be employed which comprises a hot plate 10 for uniformly cooling the X-ray absorber 4 and a cooling pipe 11 for lowering the temperature of the hot plate 10 and in which the hot plate 10 is heated to 300° C. and the cooling pipe 11 is structured to be capable of cooling the hot plate 10 heated to 300° C. to 260° C. Thus, the specified temperature distribution shown in FIG. 2B can easily be obtained so that an advantage similar to that obtainable from the first embodiment is easily realized.

Figure 5:
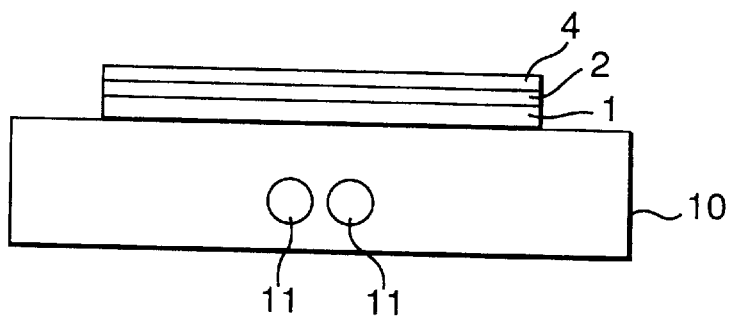
FIG. 5 is a cross sectional view showing the method of manufacturing the X-ray mask and the heating apparatus according to the second embodiment of the present invention.

In a case where the temperature distribution as shown in FIG. 2B is not realized, a structure having the cooling pipe 11 disposed at a required position as shown in, for example, FIG. 5, of course, enables another temperature distribution to be realized.

Third Embodiment

Figure 6:
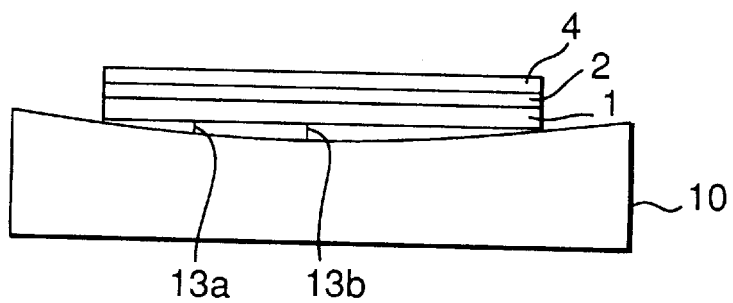
FIG. 6 is a cross sectional view showing a method of manufacturing an X-ray mask and a heating apparatus according to a third embodiment of the present invention.

FIG. 6 is a cross sectional view showing a method of manufacturing an X-ray mask and a heating apparatus according to a third embodiment of the present invention. Referring to FIG. 6, similar elements to those according to the first embodiment are given the same reference numerals and the similar elements are omitted from illustration. Reference numeral 12 represents a hot plate capable of heating the X-ray absorber 4 at uniform temperature, for example, at 300° C., and 13a and 13b represent gaps between the hot plate 12 and the silicon substrate 1, that is, between the hot plate 12 and the X-ray absorber 4. The length of each of the gaps 13a and 13b is changed to correspond to the thin film stress distribution over the X-ray absorber 4 so as to cause the X-ray absorber 4 to be heated at the temperature which is lower than the heating temperature of the hot plate 12 to correspond to each gap length.

Therefore, the third embodiment has the foregoing structure such that the length of each of the gaps 13a and 13b is changed as shown in FIG. 5 so that the X-ray absorber 4 is heated in accordance with the specified temperature distribution as shown in FIG. 2B. Therefore, an advantage similar to that obtainable from the first embodiment can be realized.

By changing the gap lengths between the hot plate 12 and the X-ray absorber 4 to correspond to the specified temperature distribution for the X-ray absorber 4, the X-ray absorber 4 can easily be heated in accordance with the specified temperature distribution for the X-ray absorber 4. As a matter of course, the structure according to this embodiment can easily be applied to a specified temperature distribution except that shown in FIG. 2B.

Fourth Embodiment

Figure 7:
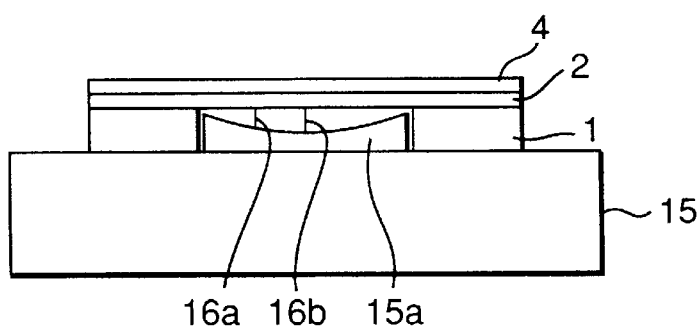
FIG. 7 is a cross sectional view showing a method of manufacturing an X-ray mask and a heating apparatus according to a fourth embodiment of the present invention.

Although the third embodiment has been described about the shape before the silicon substrate 1 is etched back, a shape formed after a portion of the silicon substrate 1 has been removed by etching back will now be described with reference to FIG. 7.

The etched back silicon substrate 1 is processed by a structure formed such that a projection 15a corresponding to the removed portion of the silicon substrate 1 is provided for the hot plate 15 which uniformly heats the X-ray absorber 4. Moreover, the length of each of gaps gap 16a and 16b between the projection 15a of the hot plate 15 and the silicon substrate 1, that is, between the projection 15a and the X-ray absorber 4, is set similarly to the third embodiment. Thus, an advantage similar to that obtainable from the third embodiment can be obtained.

Fifth Embodiment

Figure 8:
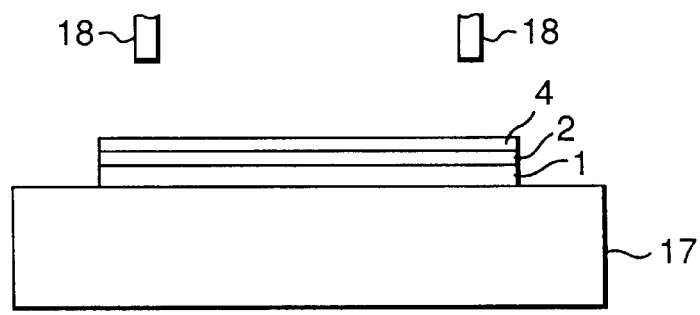
FIG. 8 is a cross sectional view showing a method of manufacturing an X-ray mask and a heating apparatus according to a fifth embodiment of the present invention.

FIG. 8 is a cross sectional view showing a method of manufacturing an X-ray mask and a heating apparatus according to a fifth embodiment of the present invention. Referring to FIG. 8, similar elements to those according to the first embodiment are given the same reference numerals and the similar elements are omitted from illustration. Reference numeral 17 represents a hot plate for uniformly heating the X-ray absorber 4 to, for example, 300° C., and 18 represents a discharge means for discharging air or nitrogen gas or the like, which is cooling gas, the temperature of which is room temperature and which is used to cool the X-ray absorber 4.

According to the fifth embodiment structured as described above, the discharge means 18 discharges the cooling gas to cool the X-ray absorber 4 as shown in FIG. 8 in a state where the X-ray absorber 4 is uniformly heated by the hot plate 17 so that the X-ray absorber 4 is heated in accordance with the specified temperature distribution as shown in FIG. 2B. Therefore, an advantage similar to that obtainable from the first embodiment can be obtained.

By shifting the discharge means 18 to correspond to the specified temperature distribution for the X-ray absorber 4, the X-ray absorber 4 can easily be heated in accordance with the specified temperature distribution for the X-ray absorber 4. As a matter of course, the structure according to this embodiment may be applied to a temperature distribution except that shown in FIG. 2B.

Sixth Embodiment

Although each of the foregoing embodiments has the structure such that the temperature distribution shown in FIG. 2B is realized to correspond to the thin film stress distribution over the X-ray absorber shown in FIG. 2A, this embodiment has a structure arranged to correspond to a thin film stress distribution over the X-ray absorber different from that shown in FIG. 2B.

Figure 9A:
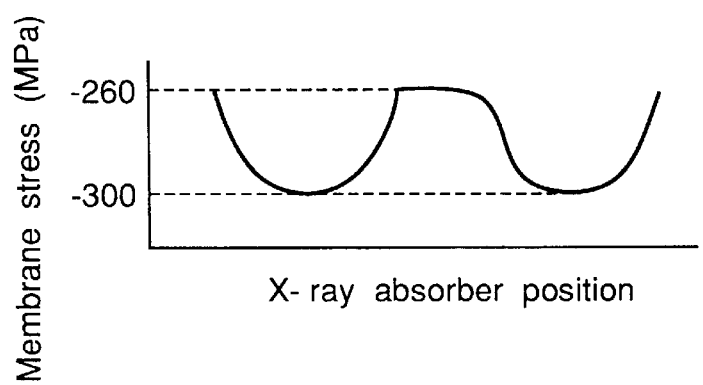
FIGS. 9A and 9B are graphs showing a thin film stress distribution and a specified temperature distribution for the X-ray absorber according to a sixth embodiment of the present invention.
Figure 9B:
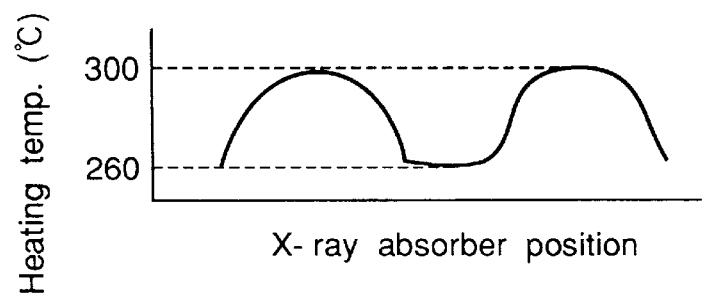

If the thin film stress distribution over the X-ray absorber formed under the same conditions employed in the first embodiment is realized as shown in FIG. 9A, a specified temperature distribution for the X-ray absorber is made to be as shown in FIG. 9B. The foregoing fact is apparent from the description of the first embodiment.

Figure 10:
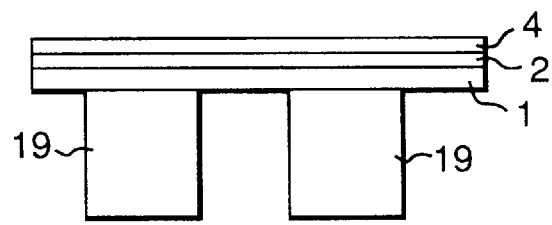
FIG. 10 is a cross sectional view showing a method of manufacturing an X-ray mask and a heating apparatus according to the sixth embodiment of the present invention.

To heat the X-ray absorber in accordance with the specific temperature distribution, a hot plate 19 is formed into an annular shape, as shown in FIG. 10, and the X-ray absorber 4 is heated to, for example, 300° C. By placing and heating the silicon substrate 1 on the hot plate 19 as shown in FIG. 10, the X-ray absorber 4 is heated, as shown in FIG. 9B. Thus, the thin film stress of the X-ray absorber 4 is made to be zero. As a result, an advantage similar to that obtainable from the first embodiment can be obtained.

Seventh Embodiment

Figure 11:
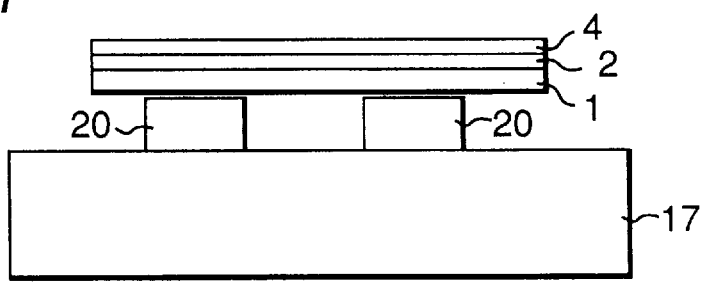
FIG. 11 is a cross sectional view showing a method of manufacturing an X-ray mask and a heating apparatus according to a seventh embodiment of the present invention.

FIG. 11 is a cross sectional view showing a method of manufacturing an X-ray mask and the structure of a heating apparatus according to a seventh embodiment of the present invention. Referring to FIG. 11, similar elements to those according to the sixth embodiment are given the same reference numerals and the similar elements are omitted from illustration. Reference numeral 20 represents a metal plate formed on the hot plate 17 and having an annular shape.

In the seventh embodiment having the foregoing structure, the silicon substrate 1 is, through the metal plate 20, heated by the hot plate 17 which is capable of realizing a uniform temperature distribution of, for example, 300° C. Thus, the X-ray absorber 4 is heated at the positions opposite to the metal plate 20 to the temperature equivalent to that of the hot plate 17. Since the other portions are apart from the metal plate 20, the temperature of the other portions is lowered correspondently. Therefore, the X-ray absorber 4 can be heated in accordance with the specified temperature distribution for the X-ray absorber 4 as shown in FIG. 9B. Thus, an advantage similar to that obtainable from the sixth embodiment can be obtained.

By changing the shape of the metal plate 20 to correspond to the specified temperature distribution for the X-ray absorber 4, the X-ray absorber 4 can easily be heated in accordance with the specified temperature distribution. As matter of course, the structure according to this embodiment may easily be applied to a specified temperature distribution except that shown in FIG. 9B.

Eighth Embodiment

Figure 12:
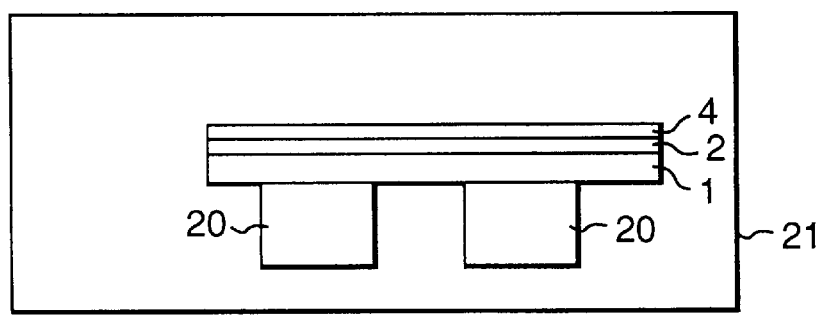
FIG. 12 is a cross sectional view showing a method of manufacturing an X-ray mask and a heating apparatus according to an eighth embodiment of the present invention.

FIG. 12 is a cross sectional view showing a method of manufacturing an X-ray mask and a heating apparatus according to an eighth embodiment of the present invention. Referring to FIG. 12, similar elements to those according to the first embodiment are given the same reference numerals and the similar elements are omitted from illustration. Reference numeral 21 represents an oven for uniformly heating the X-ray absorber 4. Reference numeral 22 represents an annular heat sink 22 disposed below the silicon substrate 1 and made of, for example, stainless steel or copper or aluminum.

In the eighth embodiment having the foregoing structure, the heating temperature of the oven 21 is set to be the lowest temperature in the specified temperature distribution for the X-ray absorber 4; and the heat sink 22 is enabled to heat the X-ray absorber 4 to the highest temperature in the specified temperature distribution for the X-ray absorber 4 by causing the heat sink 22 to previously store a required thermal capacity. By setting the respective temperature levels as described above, the portion of the X-ray absorber 4 corresponding to the heat sink 22 is heated to the highest temperature in the specified temperature distribution. Thus, the X-ray absorber 4 is heated in accordance with the specified temperature distribution as shown in FIG. 9B. Thus, an advantage similar to that obtainable from the sixth embodiment can be obtained.

By shifting the heat sink 22 to correspond to the specified temperature distribution for the X-ray absorber 4, the X-ray absorber 4 can easily be heated in accordance with the specified temperature distribution for the X-ray absorber 4. As a result, the structure according to this embodiment may, of course and easily, be applied to a specified temperature distribution except the specified temperature distribution shown in FIG. 9B.

Ninth Embodiment

Figure 13:
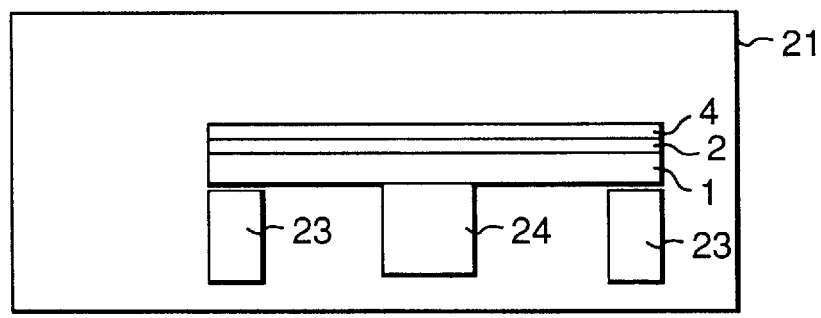
FIG. 13 is a cross sectional view showing a method of manufacturing an X-ray mask and a heating apparatus according to a ninth embodiment of the present invention.

FIG. 13 is a cross sectional view showing a method of manufacturing an X-ray mask and the structure of a heating apparatus according to a ninth embodiment of the present invention. Referring to FIG. 13, similar elements to those according to the eighth embodiment are given the same reference numerals and the similar elements are omitted from illustration. Reference numeral 23 represents an annular heat sink disposed below the silicon substrate 1. Reference numeral 24 represents a heat sink disposed in the central portion below the silicon substrate 1. The heat sinks 23 and 24 are made of, for example, stainless steel or copper or aluminum.

In the ninth embodiment having the foregoing structure, the heating temperature of the oven 21 is set to be the highest temperature in the specified temperature distribution for the X-ray absorber 4; and the heat sinks 23 and 24 are enabled to lower the temperature of the X-ray absorber 4 to the lowest temperature in the specified temperature distribution for the X-ray absorber 4. As a result, the X-ray absorber 4 is heated by the oven 21 and the heat of portions of the X-ray absorber 4 correspond to the heat sinks 23 and 24 is absorbed by the heat sinks 23 and 24. Thus, the X-ray absorber 4 is heated in accordance with the specified temperature distribution as shown in FIG. 9B. Thus, an advantage similar to that obtainable from the sixth embodiment can be obtained.

By shifting the heat sinks 23 and 24 to correspond to the specified temperature distribution for the X-ray absorber 4, the X-ray absorber 4 can easily be heated in accordance with the specified temperature distribution. As a result, the structure according to this embodiment may, of course and easily, be applied to a specified temperature distribution except the specified temperature distribution shown in FIG. 9B.

Tenth Embodiment

Figure 14:
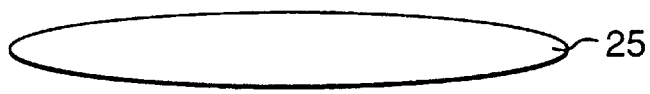
FIG. 14 is a cross sectional view showing a method of manufacturing an X-ray mask and a heating apparatus according to a tenth embodiment of the present invention.
Figure 14:
Figure 14:
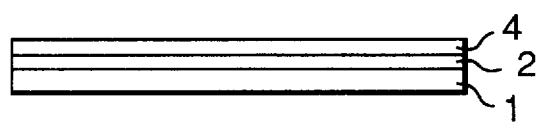

FIG. 14 is a cross sectional view showing a method of manufacturing an X-ray mask and the structure of a heating apparatus according to a tenth embodiment of the present invention. Referring to FIG. 14, similar elements to those according to the sixth embodiment are given the same reference numerals and the similar elements are omitted from illustration. Reference numeral 25 represents a heating lamp and 26 represents a mask made of, for example, aluminum or stainless steel and arranged to intercept radiant heat from the heating lamp 25, the mask 26 being patterned to correspond to the thin film stress distribution over the X-ray absorber 4.

In the tenth embodiment having the foregoing structure, the X-ray absorber 4 is heated by the heating lamp 25 through the mask 26 so that the X-ray absorber 4 is heated to correspond to the pattern of the mask 26. Since the mask 26 is patterned as illustrated, the X-ray absorber 4 can be heated in accordance with the specified temperature distribution shown in FIG. 2B. Thus, an advantage similar to that obtainable from the sixth embodiment can be obtained.

By changing patterning of the mask 26 to correspond to the specified temperature distribution for the X-ray absorber 4, the X-ray absorber 4 can easily be heated in accordance with the specified temperature distribution. As a result, the structure according to this embodiment may, of course and easily, be applied to a specified temperature distribution except the specified temperature distribution shown in FIG. 9B.

Eleventh Embodiment

Figure 15:
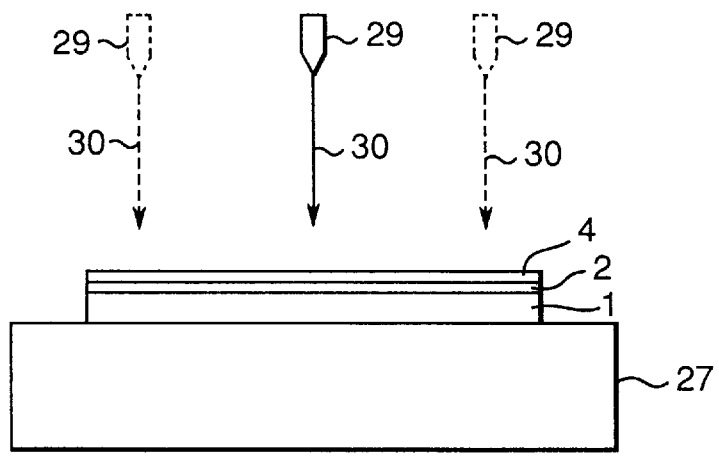
FIG. 15 is a cross sectional view showing a method of manufacturing an X-ray mask and a heating apparatus according to an eleventh embodiment of the present invention.

FIG. 15 is a cross sectional view showing a method of manufacturing an X-ray mask and the structure of a heating apparatus according to an eleventh embodiment of the present invention. Referring to FIG. 15, similar elements to those according to the sixth embodiment are given the same reference numerals and the similar elements are omitted from illustration. Reference numeral 29 represents a laser output for radiating a laser beam 30 to an X-ray absorber.

In the eleventh embodiment having the foregoing structure, the X-ray absorber 4 is heated by the laser output 29 while moving the laser beam 30 on the X-ray absorber and adjusting the strength of the laser beam 30 so that the X-ray absorber 4 is heated to correspond to the specified temperature distribution. Thus, an advantage similar to that obtainable from the above embodiments can be obtained.

Twelfth Embodiment

Although the foregoing embodiments have the structure such that the thin film stress of the X-ray absorber is adjusted with heat generated by annealing to be performed one time, the present invention is not limited to this. In a case where the thin film stress is adjusted with heat generated by annealing to be performed plural times, a structure may be employed which comprises the steps of uniformly heating the X-ray absorber before final annealing is performed; measuring the thin film stress distribution over the annealed X-ray absorber immediately before final annealing is performed; and arbitrarily employing the structure of each of the foregoing embodiment in the operation of heating the X-ray absorber with heat generated by final annealing in accordance with the specified temperature distribution with which the thin film stress can be made to be zero throughout the X-ray absorber 4. As a matter of course, an advantage similar to that obtainable from each of the embodiments can be obtained. Since the thin film stress of the X-ray absorber is adjusted with heat generated by annealing performed plural times, another advantage of improving reproducibility can be obtained.

Thirteenth Embodiment

Figure 16:
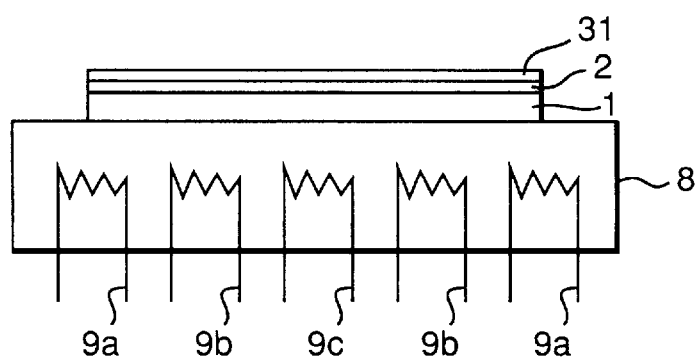
FIG. 16 is a cross sectional view showing a method of manufacturing an X-ray mask and a heating apparatus according to a thirteenth embodiment of the present invention.

Although the foregoing embodiments show examples where the thin film stress is made zero in all the locations by annealing after the thin film making of the X-ray absorber 4, the present invention is not limited to this. By the manufacturing method similar to that of the embodiments 1, the X-ray absorber 4 is laminated so as to obtain the specified temperature distribution where the thin film stress of the X-ray absorber 4 becomes zero in all the locations with the thin film stress distribution being measured. As in FIG. 16, heating is performed by annealing with the use of heaters 9a, 9b, 9c to obtain the similar specified temperature distribution by a hot plate 8 as a heating apparatus as in the embodiment 1, and the thin film stress can be made zero in each location of the X-ray absorber as in each embodiment if the X-ray absorber 31 is laminated by annealing the thin film stress so that the same effect can be achieved as in the respective embodiment.

Although the respective heating apparatuses of FIG. 1, FIG. 4 through FIG. 7, FIG. 10 through FIG. 13 among the above described respective embodiments to perform an annealing operation in the laminating of the X-ray absorber can be used similarly, the respective heating apparatuses of FIG. 3, FIG. 8, FIG. 14 cannot be used, because the heating apparatuses influence the laminated condition of the X-ray absorber.

Fourteenth Embodiment

In the above described respective embodiments, the thin film stress of the X-ray absorber is adjusted by way of example with heating generated by annealing, the other examples will be described hereinafter. First, the X-ray absorber 4 is laminated by the manufacturing method similar to the above embodiment 1 to measure the thin film stress distribution. An ion injecting amount distribution is obtained where the thin film stress of the X-ray absorber 4 may become zero in all the locations. Here, use, for example, argon ion as ion.

Figure 17:
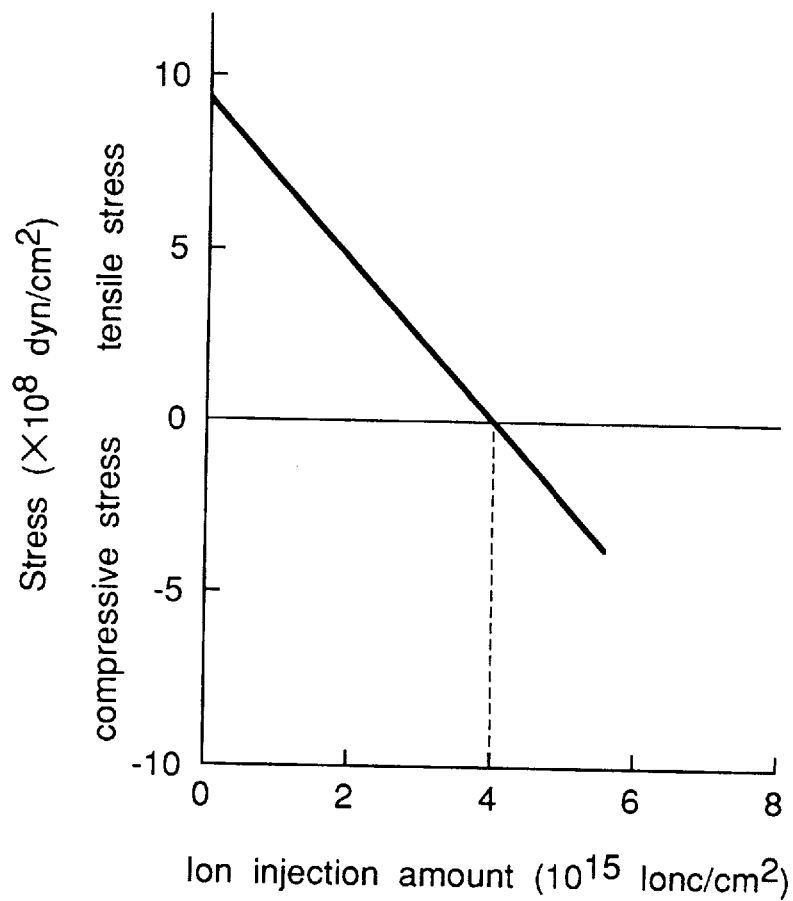
FIG. 17 is a graph showing change of the thin film stress against Ar injection amount of the X-ray mask according to a fourteenth embodiment of the present invention.
Figure 18:
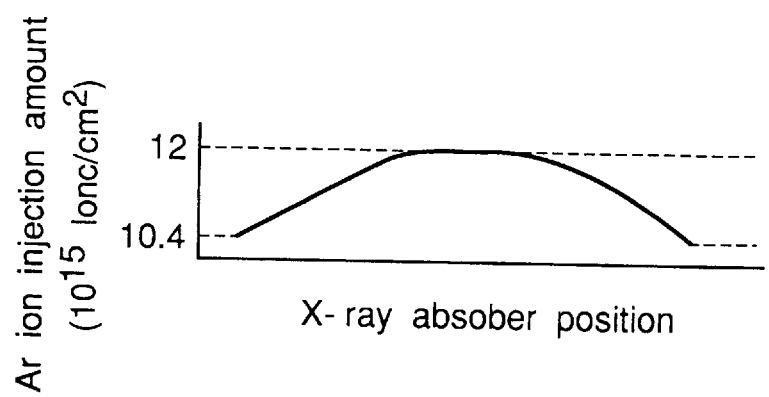
FIG. 18 is a graph showing the ion injection amount of the X-ray absorber according to a fourteenth embodiment of the present invention.

FIG. 17 shows changes in stress with respect to the injection amount of argon ion. As shown in the drawing, inject the argon ion by $4 \times 10^{13}$ Ionc/cm$^2$, and the stress can be lowered by 100 MPa. Obtain the ion injection amount distribution, where the thin film stress of the X-ray absorber becomes zero in all the locations, with respect to the thin film stress distribution of the X-ray absorber shown in FIG. 2A, and it is obtained as shown in FIG. 18. Inject argon ion into the X-ray absorber 4 in accordance with such ion injection amount distribution as shown in FIG. 18, and make the thin film stress of the X-ray absorber 4 zero.

A method of manufacturing an X-ray mask in the embodiment 14 performed hereinabove has the steps of measuring the thin film stress distribution of the X-ray absorber after the thin film of the X-ray absorber 4 is made, injecting the ion with the ion injection amount distribution where the thin film stress becomes zero in the respective locations of the X-ray absorber, and making the thin film stress zero in all the locations of the X-ray absorber 4. The X-ray absorber patterned can be prevented from being slipped due to the thin film stress so that the desired patterned X-ray mask can be obtained.

Figure 19:
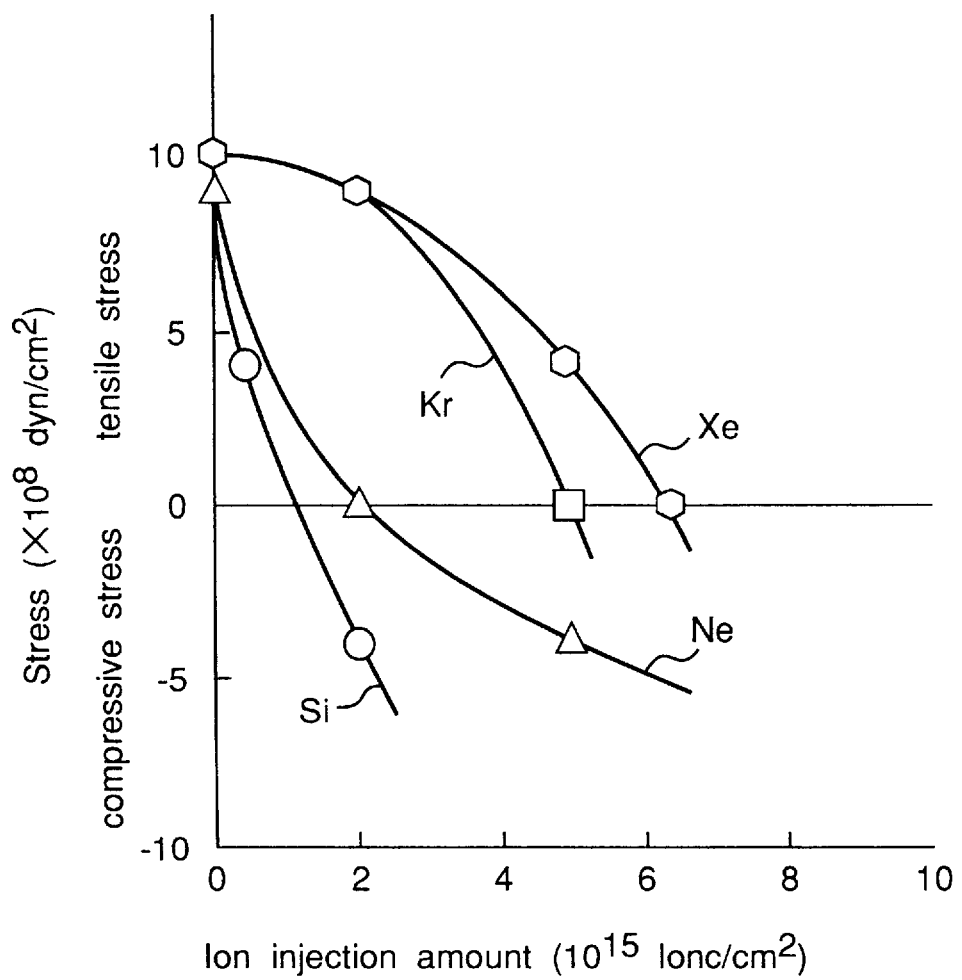
FIG. 19 is a graph showing changes of the thin film stress against each ion injection amounts of the X-ray mask according to a fourteenth embodiment of the present invention.

Also, in the above described embodiment 14, argon ion is used by way of example. The present invention is not restricted to it. As in FIG. 19, the stress of the X-ray absorber can be used similarly, because it can be adjusted as in silicon ion (Si), neon iron (Ne), krypton ion (Kr), xenon ion (Xe) or the like.

Fifteenth Embodiment

Figure 20:
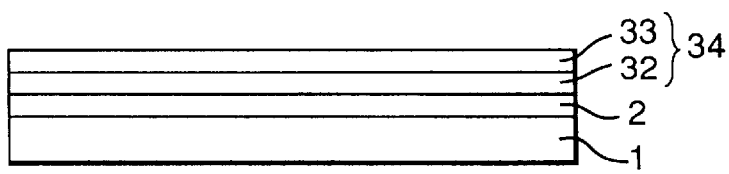
FIG. 20 is a cross sectional view showing a method of manufacturing an X-ray mask according to a fifteenth embodiment of the present invention.

FIG. 20 is a cross sectional view showing a method of manufacturing an X-ray mask in the embodiment 15 of the present invention. Referring to FIG. 20, similar elements to those of the conventional structures are given the same reference numerals and the similar elements are omitted from description. Reference numerals 32, 33, X-ray absorbers laminated sequentially with changes in the thin film making conditions on the membrane 2, are laminated same in thickness. The final X-ray absorber 34 is formed with the X-ray absorbers 32, 33.

Figure 21A:
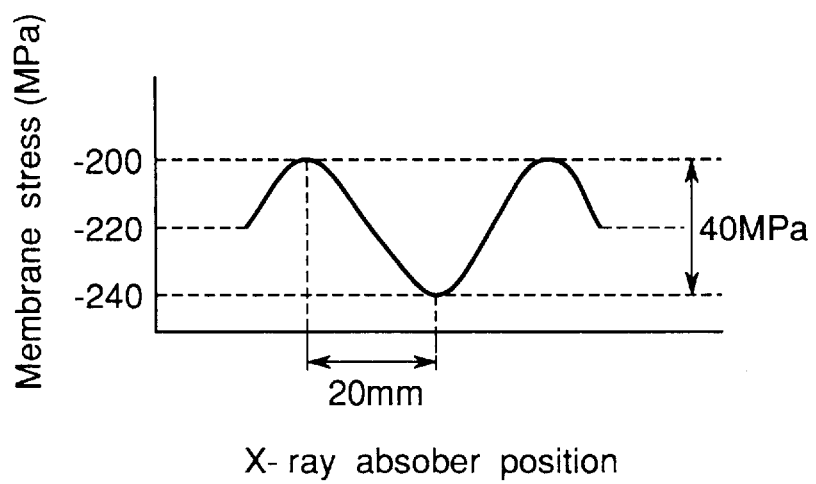
FIGS. 21A and 21B are graphs showing thin film stress distributions of the X-ray absorber according to a fifteenth embodiment of the present invention.
Figure 21B:
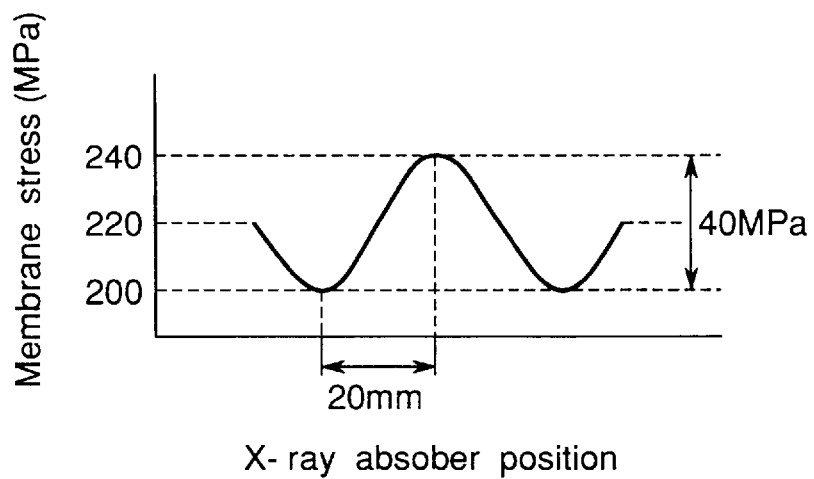

The thin film stress distribution, when the X-ray absorbers 32, 33 has been made in thin film under the respective thin film making conditions of the X-ray absorbers 32, 33 in this case, is set as shown in FIG. 21A, 21B. As shown in FIG. 21A, 21B, the thin film stress of the final X-ray absorber 34 can be made zero in all the respective locations when the thin film stress in the respective locations of the X-ray absorber is set to become zero by setting off the respective thin film stress distribution of the X-ray absorbers 32, 33 among the thin film making conditions.

The first thin film making conditions of the X-ray absorber 32 are 8.5 m Torr in pressure, argon gas/nitrogen gas=93/7 in gas, 650 W in sputter power to make a thin film of the X-ray absorber 32 which becomes a distribution from −200 MPa to −240 MPa as in FIG. 21A. As the second thin film making conditions of the X-ray absorber 32, the X-ray absorber is externally slipped from the revolution center by approximately 20 mm from the position on the revolution substrate at sputtering of the X-ray absorber 32, is varied to a position where the distribution sets off the thin film stress distribution of FIG. 21A. The thin film is made under the conditions where 10.0 m Torr in pressure, argon gas/nitrogen gas=93/7 in gas, 700 W in sputter power to make a thin film of the X-ray absorber 33 which becomes a thin film stress distribution from −240 MPa to −200 MPa as shown in FIG. 21B.

In a method of manufacturing an X-ray mask of the embodiment 15 performed as described hereinabove, the respective thin film stress distributions of the X-ray absorbers 32, 33 among both the thin film making conditions of the X-ray absorbers 32, 33 are set off to make the thin film stress zero in the respective locations of the final X-ray absorber 34. Thus, the final X-ray absorber 34 patterned is prevented from becoming skidded because of the thin film stress, thus making it possible to obtain the X-ray mask patterned as desired.

In the above described embodiment 15, although the final X-ray absorber 34 is made by way of example by the X-ray absorbers 32, 33 to be made in thin film under the first and second two thin film forming conditions, the present invention is not restricted to it. The thin film may be made under the thin film making conditions of two times or more. The adjustment of the thin film stress distribution is further easier to perform under the thin film making conditions of two time or more.

Sixteenth Embodiment

Although heating conditions generated by annealing is not added to the thin film making conditions in the embodiment 15, it is better in stability for the X-ray absorber to effect an heating operation by annealing. A case where the heating generated by annealing is added to the thin film making conditions will be described hereinafter.

A method of manufacturing an X-ray mask in the embodiment 16 in accordance with the FIG. 22. The first thin film making conditions are 8.5 m Torr in pressure, argon gas/ nitrogen gas=93/7 in gas, 650 W in sputter power to make a thin film. The thin film stress distribution of the X-ray absorber from −200 MPa to −240 MPa as described in FIG. 22A is obtained. Then, the uniform heating by annealing of the X-ray absorber is effected at 220° C. to obtain the thin film stress distribution of the X-ray absorber from 20 MPa to −20 MPa as shown in FIG. 22B.

Figure 22A:
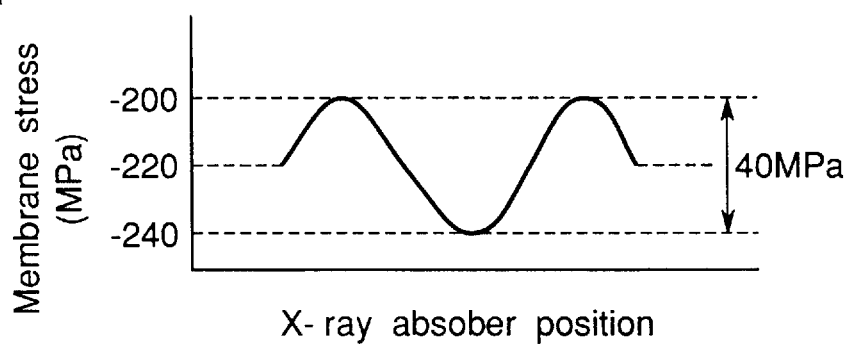
FIGS. 22A, 22B, 22C and 22D are graphs showing thin film stress distributions of the X-ray absorber according to a sixteenth embodiment of the present invention.

The second thin film making conditions are 8.5 m Torr in pressure, argon gas/nitrogen gas=93/7 in gas, 650 W in sputter power as in the first thin film making conditions. The X-ray absorber is externally slipped from the revolution center by approximately 20 mm from the position on the revolution substrate at sputtering of the first thin film making conditions, is varied to a position where the distribution sets off the thin film stress distribution of FIG. 22A, effects the uniform heating at 220° C. by annealing of the X-ray absorber after obtaining the thin film stress distribution of the X-ray absorber from −200 MPa to −240 MPa as shown in FIG. 22C to obtain the thin film stress distribution of the X-ray absorber from −20 MPa to −20 MPa as shown in FIG. 22D.

Figure 22B:
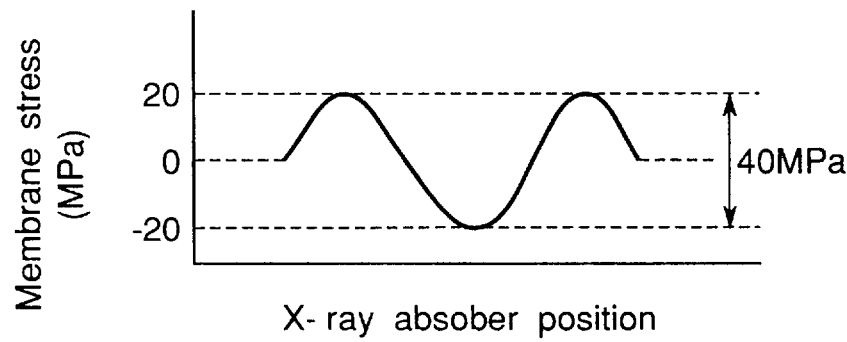
Figure 22C:
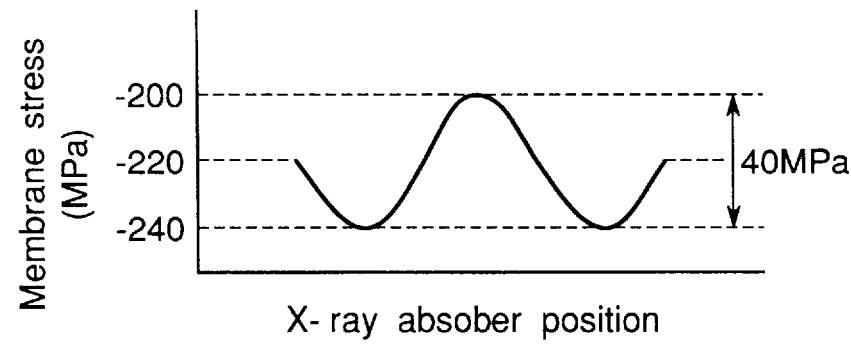
Figure 22D:
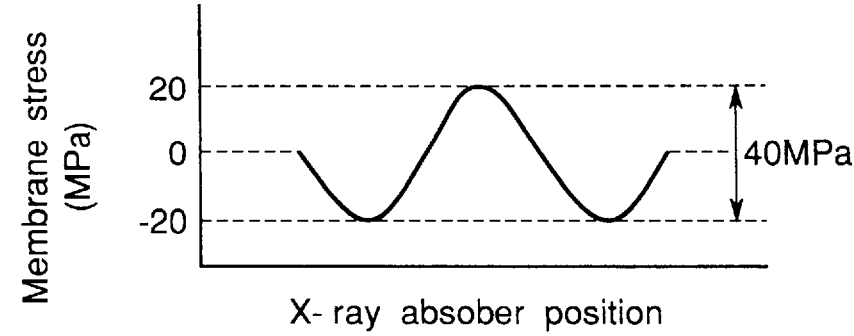

The final X-ray absorber is to obtain the thin film stress distribution of FIG. 22B and FIG. 22C. The thin film stress distribution of FIG. 22B and FIG. 22C is set off to make the thin film stress zero in the respective locations in the X-ray absorber. As the heating temperature at the second thin film making conditions is the same as the heating temperature at the first thin film making conditions, the thin film stress distribution of the X-ray absorber made in thin film under the first thin film making conditions does not change at the heating time of the second thin film making conditions.

A method of manufacturing an X-ray mask in the embodiment 16 performed as described hereinabove is capable of, not only obtaining the same effect as in the embodiment 15, but also improving the stability of the X-absorber because of being heated by annealing.

Also, although the embodiment 16 has added the conditions of heating by annealing for the respecting thin film making conditions, the present invention is not restricted to this. Suppose the conditions of heating by annealing is added to only the final thin film making conditions, and the stability of the X-ray absorber can be improved as in the embodiment 16.

Suppose the thin film is made to have the thin film stress distribution of FIG. 22A and FIG. 22C, and the uniform heating at 220° C. by annealing of the X-ray absorber, and the thin film stress in the respective locations of the X-ray absorber becomes zero.

Figure 23A:
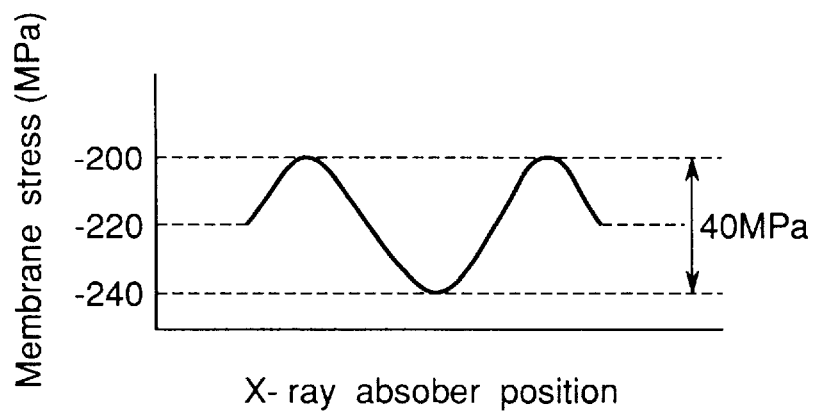
FIGS. 23A and 23B are graphs showing thin film stress distributions of the X-ray absorber according to a sixteenth embodiment of the present invention.
Figure 23B:
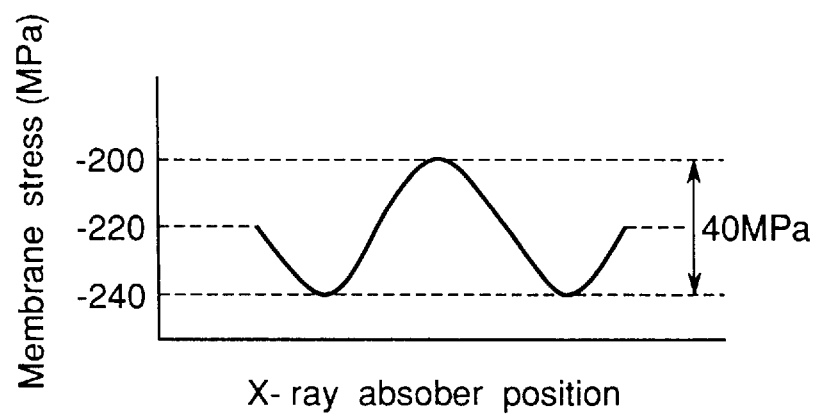

As the first thin film making conditions, 8.5 m Torr in pressure, argon gas/nitrogen gas=93/7 in gas, 650 W in sputter power are provided to make a thin film to obtain the thin film stress distribution of the X-ray absorber from −200 MPa to −240 MPa as shown in FIG. 23A. The second thin film making conditions are 8.5 m Torr in pressure, argon gas/nitrogen gas=93/7 in gas, 650 W in sputter power as in the above described first thin film making conditions to make a thin film. The X-ray absorber is externally slipped from the revolution center by approximately 20 mm from the position on the revolution substrate at sputtering of the above described first thin film making conditions, is varied to a position where the distribution sets off the thin film stress distribution of FIG. 23A, and effects the uniform heating at 220° C. by annealing of the X-ray absorber after obtaining the thin film stress distribution of the X-ray absorber from −200 MPa to −240 MPa as shown in FIG. 23B.

In the heating generated by annealing of the second thin film making conditions, the X-ray absorber made in thin film under the first thin film making conditions is heated likewise. Thus, although the thin film stress distribution of the X-ray absorber of FIG. 23A, 23B becomes equal to −220 MPa in the respective locations, the thin film stress distribution of the X-ray absorber becomes zero in the respective locations by the uniform heating of 220° C. of the annealing under the second thin film making conditions.

Seventeenth Embodiment

Figure 24:
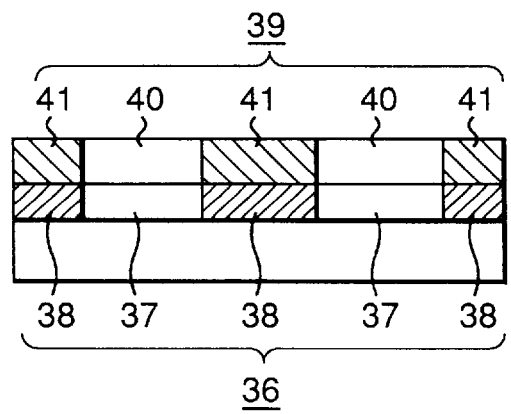
FIG. 24 is a cross sectional view showing a method of manufacturing an X-ray mask according to a seventeenth embodiment of the present invention.

FIG. 24 is a cross sectional view showing the construction of the X-ray mask manufacturing method of the embodiment 17 of the present invention. Referring to the drawing, reference numeral 35 is a silicon substrate, 36 represents a thin film laminated on the silicon substrate 35, having a flat location 37 on surface and an uneven or rough location 38. 39 represents an X-ray absorber laminated on the thin film 36, having a location 40 having an amorphous structure and a location 41 having no amorphous structure.

Figure 25A:
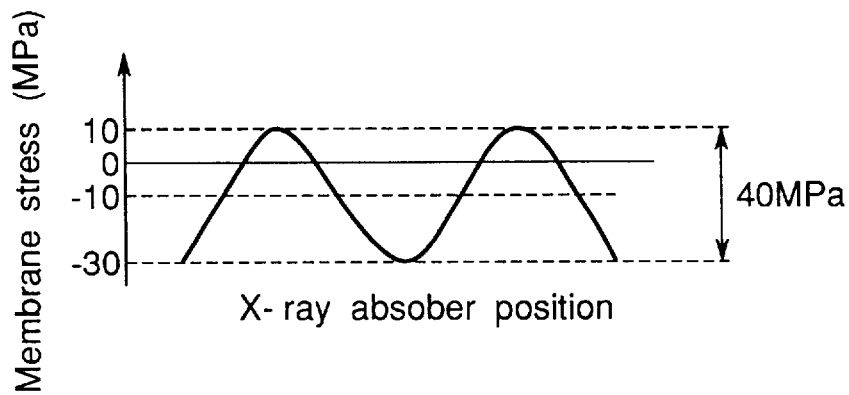
FIGS. 25A and 25B are graphs showing thin film stress distributions of the X-ray absorber according to a seventeenth embodiment of the present invention.
Figure 25B:
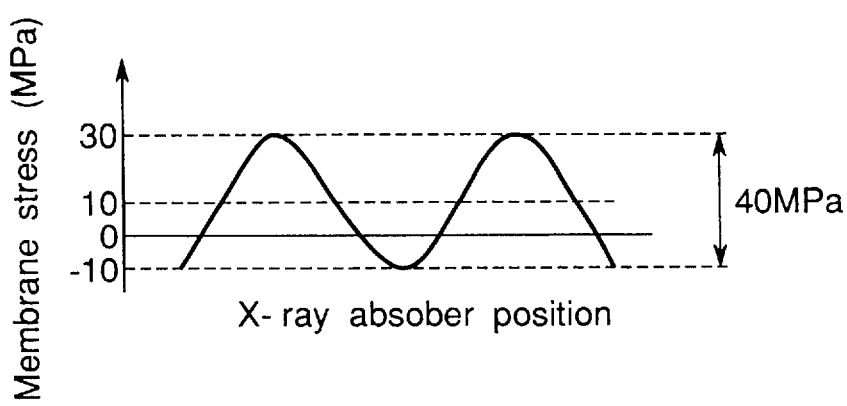
Figure 26:
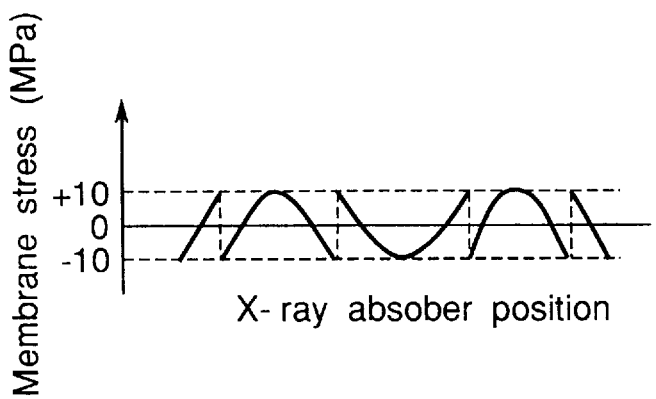
FIG. 26 is a graph showing a thin film stress distribution of the X-ray absorber according to a seventeenth embodiment of the present invention.

A method of manufacturing an X-ray mask of the embodiment 17 constructed as hereinabove will be described in FIG. 24 through FIG. 26. When the thin film is flat in all the locations, it is made under the thin film making conditions, 9.0 m Torr in pressure, argon gas/nitrogen gas=93/7 in gas, 650 W in sputter power. Such thin film stress distribution of the X-ray absorber as shown in FIG. 25(a) is obtained. Also, under the similar thin film making conduction, such thin film stress distribution of X-ray absorber as in FIG. 25B is obtained when the thin film is uneven in all the locations.

This phenomenon is laminated, because the X-ray absorber is in a columnar structure on the pulling stress side, being hard to become the amorphous structure when the lamination is performed on the uneven location although laminated in the amorphous structure having a compressive stress when the absorber is laminated on the flat location.

By using the advantage, the flat location 37 and the uneven location 38 on the membrane 36 are processed so that the uneven locations may be provided in the smaller stress of the thin film stress distribution as compared with the larger stress of the thin film stress distribution when the X-ray absorber has been made in thin film on the flat thin film. This can be formed by diamond grinding or the like into unequally grinding locations and the uniformly grinding locations. When the X-ray absorber 39 is laminated under the above described thin film making conditions, the thin film stress of the respective X-ray absorbers of FIG. 25A on the flat location 37 or of FIG. 25B on the uneven location 38 so that the X-ray absorber 39 can obtain such thin film stress distribution as shown in FIG. 26.

In a method of manufacturing the X-ray mask in the embodiment 17 constructed as above, the thin film 36, namely, the surface as the substrate of the X-ray absorber is processed so that the uneven locations may be provided in the smaller stress of the thin film stress distribution as compared with in the larger stress when the X-ray absorber has been made in thin film on the flat thin film and then, the X-ray absorber 39 is laminated. Since the thin film stress distribution of the X-ray absorber 39 can be made smaller, the X-ray absorber patterned can be prevented from being shifted due to the thin film stress, thus enabling the X-ray mask patterned as required to be obtained.

Also, although the embodiment 17 shows the flat location 37 and the uneven location 38 divided on the thin film 36 by way of example, the present invention is not restricted to this. In accordance with the thin film stress distribution when the X-ray absorber has been made in thin film on the flat thin film, the processing operation is hard to effect. Adjust in accordance with the shape of the concave and the convex, and thin film stress can be brought to zero much further.

Although the thin film stress in the flat plane direction of the X-ray absorber has been described as the thin film stress distribution in the above described respective embodiments, the thin film stress in the direction of the thickness remains unequal. The principle will be described in detail with the use of FIG. 27.

Figure 27A:
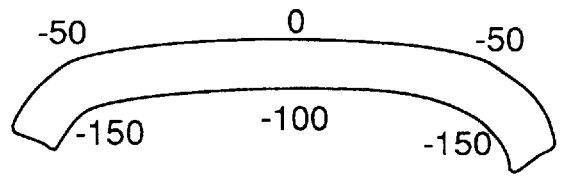
FIGS. 27A, 27B, 27C, 27D and 27E are figures showing the theory of the thin film stress in the thickness direction of the X-ray absorber according to the present invention.

First, when the X-ray absorber has been made in thin film without heating processing by the general annealing, such an X-ray absorber as shown in FIG. 27A is to be laminated. Actually the X-ray actuator has the stress of −100 MPa through 0 MPa in the direction of the thickness of the central portion, and the stress of −150 MPa through −50 MPa in the direction of the thickness of both the end portions. But the average values of the direction of the thickness are detected as shown in FIG. 27B as the thin film stress distribution of the X-ray absorber.

Figure 27B:
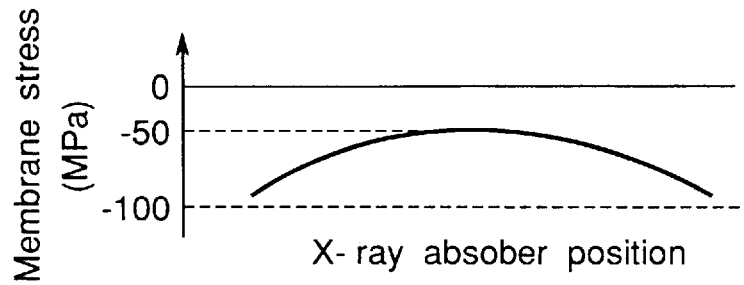
Figure 27C:
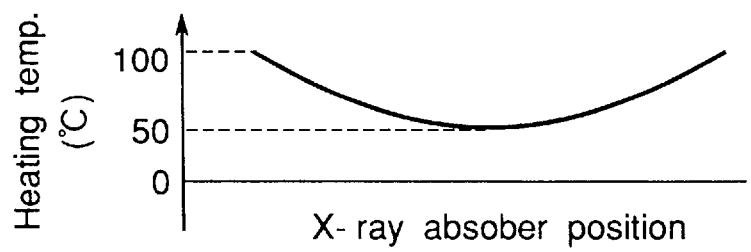
Figure 27D:
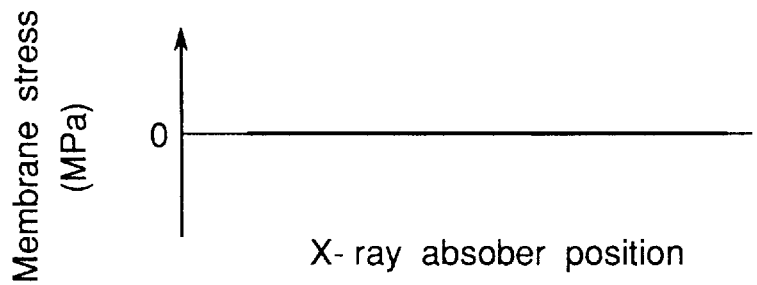
Figure 27E:
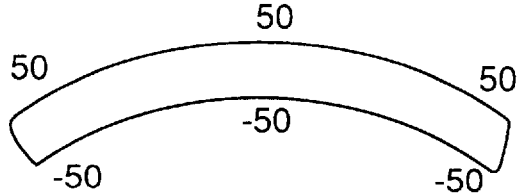

The heating by annealing in accordance with FIG. 27B was determined in specified temperature distribution as shown in FIG. 27C similarly to the respective embodiments. The X-ray absorber shown in FIG. 27A was heated by annealing in the specified temperature distribution of FIG. 27C and the X-ray absorber was formed to obtain such an X-ray absorber as shown FIG. 27D where the thin film stress in the respective locations of the X-ray absorber may become zero. Actually, since what is shown in FIG. 27A is heated by annealing at a temperature of FIG. 27C, such an X-ray absorber as shown in FIG. 27E is obtained. As clear from FIG. 27E, the thin film stress of the X-ray absorber becomes zero in the respective location with the stress in the direction of the thickness showing a value of −50 MPa through 50 MPa.

In the X-ray absorber shown in FIG. 27E, one portion of the silicon substrate 1 is removed (etched back) as in the embodiment 1, and then, resist is applied to bake at, for example, 180° C. Then, the silicon substrate 1 is bonded to an oven with a bonding agent. The resist is patterned by electronic line drawing and the development to dry-etch the X-ray absorber as the mask. The X-ray absorber is patterned to remove the resist and form the X-ray mask.

In the patterning of the X-ray absorber from among the steps of forming the above described X-ray mask, effect an over etching operation and the one portion of the upper portion of the X-ray absorber is etched. Accordingly, since a portion corresponding to pulling stress of the upper portion as clear from FIG. 27E is etched, the thin film which was zero has—few MPa to cause skids in the X-ray mask as in the conventional case.

To cope with such an over etching operation, the stress in the direction of the thickness of the X-ray absorber was caused to be made equal. The embodiment for making the stress in the direction of the thickness of the X-ray absorber will be described hereinafter.

Eighteenth Embodiment

Figure 28:
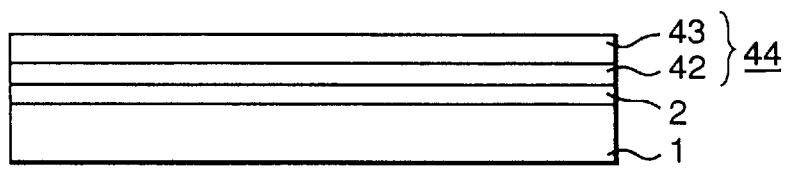
FIG. 28 is a cross sectional view showing a method of manufacturing an X-ray mask according to a eighteenth embodiment of the present invention.

FIG. 28 is a cross sectional view showing a method of manufacturing an X-ray mask in the embodiment 18 of the present invention. Referring to FIG. 28, similar elements to those of the conventional structures are given the same reference numerals and the similar elements are omitted from description. Reference numerals 42, 43 represent X-ray absorbers laminated in sequential order by changing the thin film making conditions on the membrane 2, which are laminated by, for example, 2500 Angstrom in thickness. The absorber is formed into the final X-ray absorber 44 by these X-ray absorbers 42, 43.

Figure 29A:
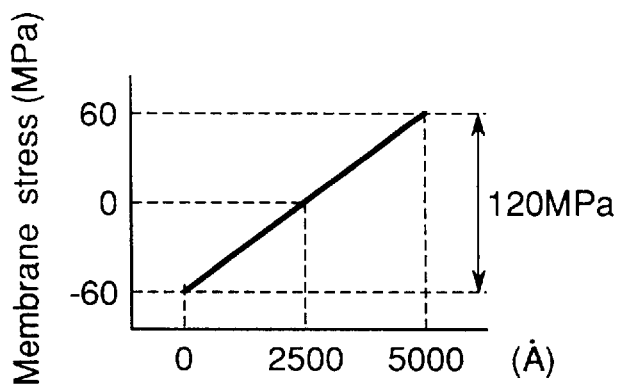
FIGS. 29A and 29B are graphs showing thin film stress distributions of the X-ray absorber according to a eighteenth embodiment of the present invention.
Figure 29B:
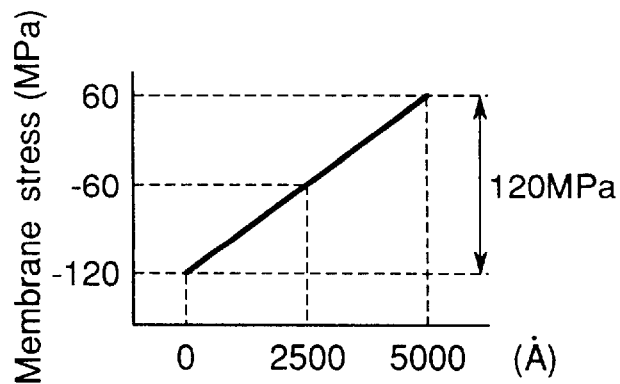

The stresses in the direction of the thickness in locations equivalent to the central portions of the X-ray absorbers 42, 43, when all the thickness of the X-ray absorption has been made in thin film under the respective thin film conditions of the X-ray absorbers 42, 43 in this case, are set as shown in FIG. 29A, 29B. Actually, a thin film is made under the first thin film making conditions of the X-ray absorber 42, 9.5 m Torr in pressure, argon gas/nitrogen gas=93/7 in gas, 620 W in sputter power to obtain the stress in the direction of the thickness as shown in FIG. 29A. Or a thin film is made under the second thin film making conditions of the X-ray absorber 43, 9.0 m Torr in pressure, argon gas/nitrogen gas=93/7 in gas, 620 W in sputter power to obtain the stress in the direction of the thickness as shown in FIG. 29B.

Figure 30:
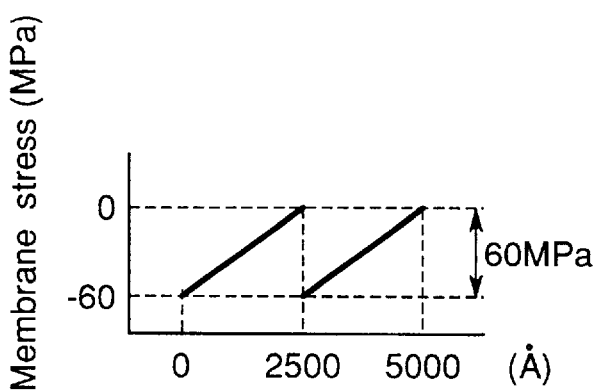
FIG. 30 is a graph showing a thin film stress distribution of the X-ray absorber according to a eighteenth embodiment of the present invention.

The X-ray absorber 42 is laminated to the thickness of 0 through 2500 Angstrom or the X-ray absorber 43 is laminated to the thickness of 2500 Angstrom through 5000 Angstrom. The stress in the direction of the thickness of the central portion of the final X-ray absorber 44 has the stress of FIG. 29A in 0 through 2500 Angstrom or has the stress of FIG. 29B in 2500 Angstrom through 5000 Angstrom as shown in FIG. 30.

As described above, the conditions of the pressure, from among the respective thin film making conditions, are gradually lowered to make the stress in the thickness direction uniform. In the thin film making of the X-ray absorber on the flat membrane 2, the granular diameter is gradually grown larger in amorphous structure from the amorphous structure of small granular diameter. Under the conditions small in granular diameter as in amorphous structure, the thin film stress becomes stronger in compression and is changed gradually onto the pulling stress side. This is used, because the conditions are likely to be formed in the amorphous structure by lowering the pressure from the thin film forming conditions.

The method of manufacturing the X-ray mask in the embodiment 18 constructed above is capable of preventing the average value of the stress in the thickness direction of the X-ray absorber from being changed by over etching or the like, because the stress in the thickness direction of the X-ray absorber is to becomes uniform through the formation of the final X-ray absorber 44 by gradual lowering of the pressure conditions from among the thin film making conditions.

Although the embodiment 18 shows a method of gradually lowering the pressure at stages, the present invention is not restricted to it. Lower the pressure continuously and gradually and much more stress unification of the stress in the direction of the thickness of the X-ray absorber can be improved.

Nineteenth Embodiment

Figure 31:
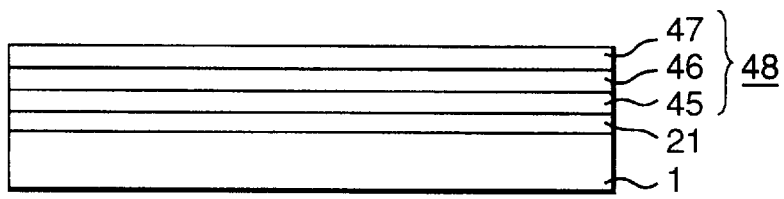
FIG. 31 is a cross sectional view showing a method of manufacturing an X-ray mask according to a nineteenth embodiment of the present invention.

FIG. 31 is a cross sectional view showing a method of manufacturing an X-ray mask in the embodiment 19 of the present invention. Referring to the drawing, similar elements to those of the conventional structure are given the same reference numerals and the similar elements are omitted from the description. Reference numerals 45, 46 and 47 represent X-ray absorbers wherein the thickness of every one third of the desired thin film thickness is made in thin film on the membrane 2 by a plurality of divisions under the same thin film making conditions, and heating is performed uniformly by annealing at a temperature in which the maximum thin film stress becomes zero after each thin film making operation. 48 is a final X-ray absorber composed of X-ray absorbers 45, 46 and 47.

A method of manufacturing the X-ray mask in the embodiment 19 constructed as above will be described hereinafter. The thin film is made on the membrane 2 under the thin film making conditions of, for example, 8.5 m Torr in pressure, argon gas/nitrogen gas=93/7 in gas, 650 W in sputter power. Initially, the X-ray absorber 45 of one third in thickness is laminated. The maximum thin film stress of the X-ray absorber 45 becomes, for example, −280 MPa. The X-ray absorber is heated by annealing at 280° C. with the X-ray absorber 45 to make the maximum thin film stress zero.

The X-ray absorber 46 of one third in thickness is laminated on the X-ray absorber 45. The maximum thin film stress of the X-ray absorber 46 becomes, for example, −260 MPa. The X-ray absorber 46 is heated by annealing at 260° C. to make the maximum thin film stress zero. Then, the X-ray absorber 47 of one third in thickness is laminated on the X-ray absorber 46. The average thin film stress of the X-ray absorber 47 becomes, for example, −240 MPa. Thus, the X-ray absorber 47 is heated by annealing at 240° C. to make the maximum thin film stress zero.

The maximum thin film stress of each X-ray absorber 46, 47 and 48 is formed to become zero. The final X-ray absorber 49 is to have the stress uniform in the direction of the thickness. As described in the embodiment 18, this is based on the fact that the thin film stress even in any location is gradually changing from the compressive stress side to the pulling stress side with respect to the direction of thickness in the lamination of the X-ray absorber on the membrane 2.

A method of manufacturing an X-ray mask in the embodiment 19 constructed as above is capable of preventing the average value of the stress in the direction of the thickness of the X-ray absorber due to over-etching or the like from being changed, because the stress in the direction of the thickness of the X-ray absorber is adapted to become uniform with the formation of the final X-ray absorber 48 by making thin film by a plurality of times under the same thin film making conditions, and uniform heating by annealing with temperature where the maximum thin film stress becomes zero after each thin film making operation.

Although the embodiment 19 shows an example of the thin film making by three divisions, the present invention is not restricted to it. Make the thin film through many divisions and heat uniformly by annealing at a temperature of zero in the maximum thin film stress, and much more unification of the stress in the direction of the thickness of the X-ray absorber.

Since the temperature of heating by annealing of the respective X-ray absorbers 46, 47 is gradually set, the thin film stress of the X-ray absorber of the former process does not change in the heating by the annealing at the later process.

Although the embodiments 18, 19 shows examples where the stress of the direction of the thickness of the X-ray absorbers is made uniform, it is necessary to combine the embodiments 18, 19 with other embodiments, because the thin film stress distribution remains unequal as it is. The principle about the combination of the uniformity of the stress in the direction of the thickness of the X-ray absorber and the uniformity of the thin film stress distribution will be described in accordance with the FIG. 32.

Figure 32A:
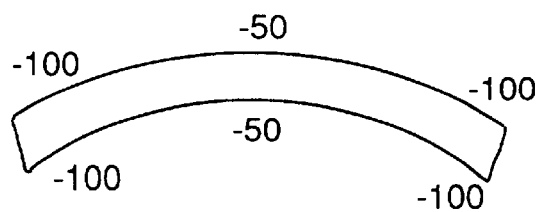
FIGS. 32A, 32B, 32C, 32D and 32E are figures showing the theory of the thin film stress in the thickness direction of the X-ray absorber according to the present invention.

Initially the thin film in the direction of the thickness of the X-ray absorber is laminated by such a method as in the embodiments 18, 19 so that the X-ray absorber is formed as shown in, for example, FIG. 32A. The X-ray absorber has the stress of −50 MPa in the central portions, the stress of −100 MPa in both the end portions, and the same, the uniform, stress in the direction of the thickness in the respective locations. However, unequal distribution from −100 MPa to −50 MPa is provided as in FIG. 32B as the thin film stress distribution of the X-ray absorber.

Figure 32B:
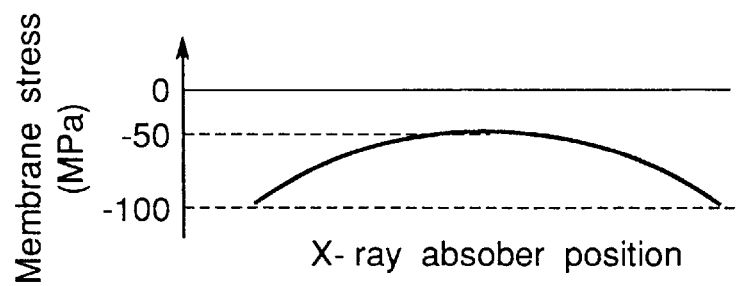
Figure 32C:
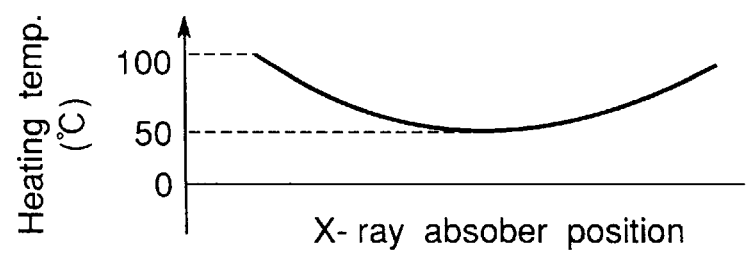
Figure 32D:
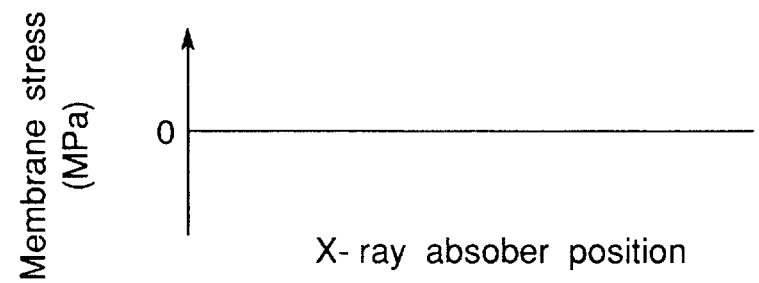

A specified temperature distribution is determined as in FIG. 32C as in the embodiment in the heating by annealing in accordance with the FIG. 32B. The X-ray absorber shown in FIG. 32A is heated by annealing in the specified temperature distribution of FIG. 32C to obtain the X-ray absorber, as shown in FIG. 32D, where the thin film stress becomes zero in the respective locations of the X-ray absorber. The thin film stress of the X-ray absorber becomes zero in the respective locations and the stress in the direction of the thickness becomes zero as shown in FIG. 32E, because the absorber shown in FIG. 32A is heated by annealing at a temperature of FIG. 32C.

Figure 32E:
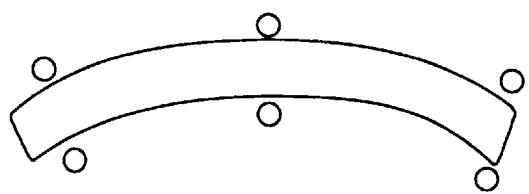
Figure 33A:
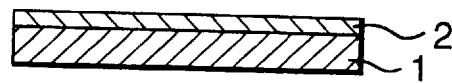
FIGS. 33A, 33B, 33C, 33D, 33E, 33F and 33G are cross sectional views showing a conventional method of manufacturing an X-ray mask.
Figure 33B:
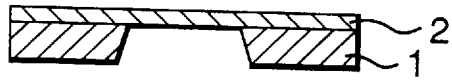
Figure 33C:
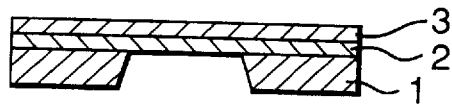
Figure 33D:
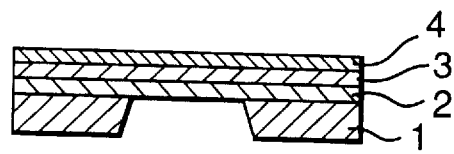
Figure 33E:
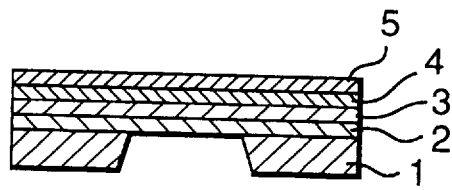
Figure 33F:
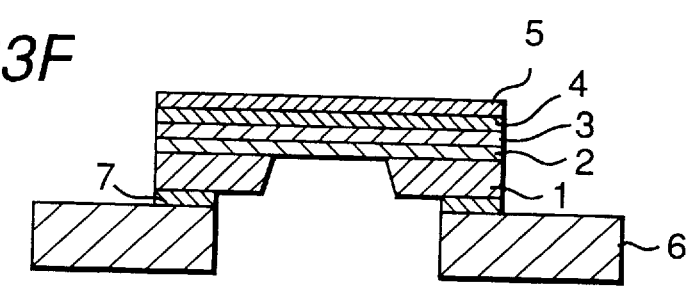
Figure 33G:
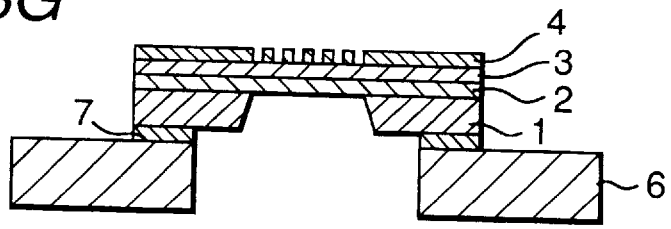
Figure 34A:
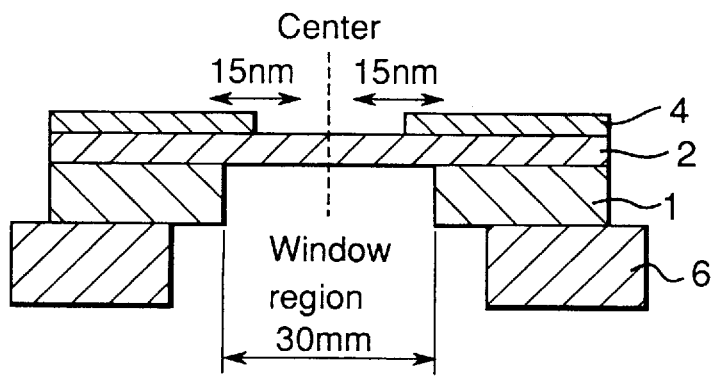
FIGS. 34A and 34B show a problem experienced with the conventional art and required to be solved.
Figure 34B:
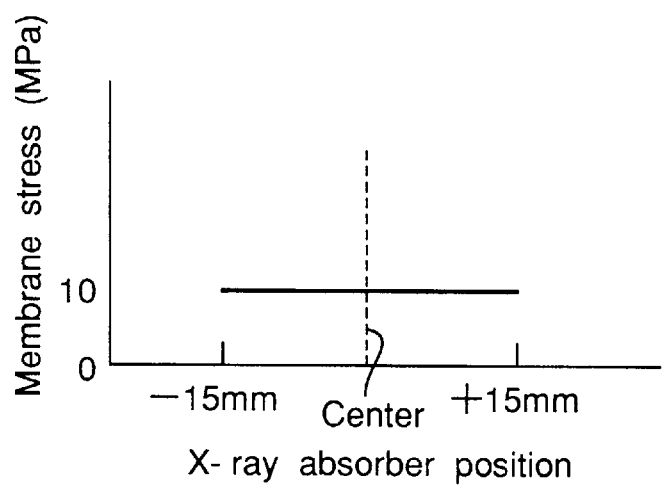
Figure 35A:
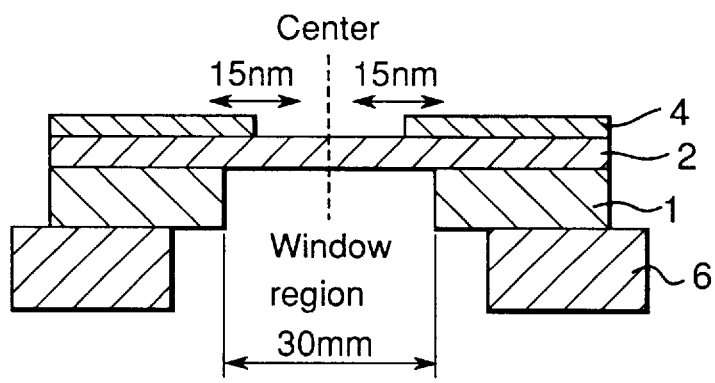
FIGS. 35A and 35B show a problem experienced with the conventional art.
Figure 35B:
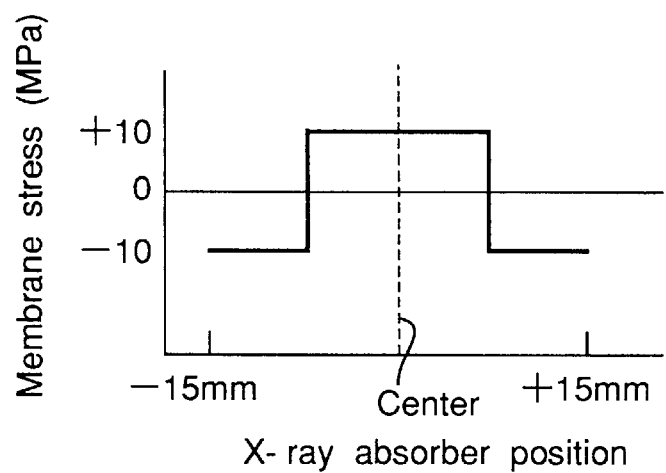

Thus, the X-ray mask shift does not arise, because the thin film stress maintains zero if the over etching is effected in the patterning of such an X-ray absorber as shown in FIG. 32E.

The uniformity of the thin film distribution of the X-ray absorber and the uniformity of the thin film stress in the direction of the thickness will be described hereinafter Twentieth Embodiment In embodiment 20 an X-ray absorber is first obtain where the thin film stress in the direction of the thickness may become uniform by a method similar to that of the eighteenth embodiment. Then, by the use of a heating apparatus as in FIG. 1 through FIG. 8, and FIG. 3, FIG. 10 through FIG. 15, heating is performed with a specified temperature distribution so that the thin film stress may become zero in the respective locations of the X-ray absorber as in the respective embodiments or ion injection is performed with a specified ion injection distribution so that the thin film stress in the respective locations of the X-ray absorber may become zero as in the embodiment 14, and the absorber can be formed as described in the FIG. 32.

Also, the X-ray absorber can be formed as in the absorber described in FIG. 32E if the X-ray absorber is made in thin film, heating with a given temperature distribution by the respective heating apparatus of FIG. 1, FIG. 4 through FIG. 7 and FIG. 10 through FIG. 13 as in the embodiment 13, and the thin film is made by gradual lowering of the pressure conditions as in the eighteenth embodiment.

Also, an X-ray absorber can be formed as in the absorber described in the FIG. 32E if the respective thin film stress distribution of the X-ray absorber is set off among the thin film making conditions to make the thin film stress in the respective location of the X-ray absorber zero as shown in the embodiment 15 or the embodiment 16, and the thin film making is effected by gradual lowering of the conditions of the pressure as in the eighteenth embodiment.

Also, when the thin film stress in the direction of the thickness of the X-ray absorber is made uniform with heating by annealing as shown in the embodiment 19, the distribution of the thin film stress of the X-ray absorber cannot be made zero in the respective locations with heating by the annealing. Effect an ion injection with the specified ion injection distribution where the thin film stress in the respective locations of the X-ray absorber becomes zero as in the embodiment 14, and the absorber can be formed as described in the FIG. 32.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

Although the embodiments have the structure such that the tungsten-titanium film is employed as the X-ray absorber, the present invention is not limited to this. An amorphous structure material containing Ta or W, for example, $Ta_4B$, $TaSiN$, $WO_3$ or $WN_x$, may, of course, be employed.

What is claimed is:

1. A method of manufacturing an X-ray mask comprising the steps of:

forming an X-ray absorber on a substrate; and annealing the X-ray absorber by heating the X-ray absorber in accordance with a specified non-uniform temperature distribution based on a measured thin film stress distribution throughout the X-ray absorber to make the thin film stress throughout the X-ray absorber substantially zero.

2. The method of manufacturing an X-ray mask according to claim 1, wherein, before said annealing step, a preliminary annealing step is carried out in such a way that the X-ray absorber is uniformly heated before final annealing and the final annealing is performed in accordance with a specified temperature distribution based on a thin film stress distribution measured just before the final annealing throughout the X-ray absorber to make the thin film stress substantially zero.

3. The method of manufacturing an X-ray mask according to claim 1, wherein the specified temperature distribution is prepared on the basis of a thin film stress distribution measured in advance with respect to an X-ray mask manufactured under similar conditions.

4. The method of manufacturing an X-ray mask according to claim 1, wherein said step of forming an X-ray absorber on a substrate is carried out while rotating the substrate to achieve a thin film stress distribution over the X-ray absorber axially symmetric with respect to a rotational axis of the substrate.

5. The method according to claim 1, wherein said annealing step is performed using a hot plate disposed beneath the substrate, the hot plate having a plurality of heating elements disposed therein, and the specified non-uniform temperature distribution is achieved by controlling the heat generated by respective heating elements so that different regions of the X-ray absorber receive different heat levels based on the measured thin film stress distribution.

6. The method according to claim 1, wherein said annealing step is performed using a hot plate disposed beneath the substrate, the hot plate having a cooling pipe disposed therein, and the specified non-uniform temperature distribution is achieved based on the positioning of the cooling pipe.

7. The method according to claim 1, wherein said annealing step is performed using a hot plate disposed beneath the substrate, a top surface of the hot plate being shaped such that gaps of different length are formed between regions of the top surface of the hot plate and the substrate, and the specified non-uniform temperature distribution is achieved by setting the lengths of respective gaps between the top surface of the hot plate and the substrate.

8. The method according to claim 1, wherein said annealing step is performed using a hot plate disposed beneath the substrate and a plurality of discharge devices disposed above the X-ray absorber, each for discharging cooling gas, and the specified non-uniform temperature distribution is achieved by controlling the positioning of the plurality of discharge devices.

9. The method according to claim 1, wherein said annealing step is performed using an annular shaped hot plate.

10. The method according to claim 1, wherein said annealing step is performed using a hot plate positioned beneath the substrate and a metal plate positioned between an upper surface of the hot plate and the substrate, and the specified non-uniform temperature distribution is achieved based on the shape of the metal plate.

11. The method according to claim 1, wherein said annealing step is performed by using an oven which heats the X-ray absorber to a uniform temperature, and a heat sink positioned beneath the substrate to absorb or radiate heat so to that the specified non-uniform temperature distribution is achieved.

12. The method according to claim 1, wherein said annealing step is performed using a heating lamp positioned above the X-ray absorber and a heating mask positioned between the heating lamp and the X-ray absorber, and the specified non-uniform temperature distribution is achieved based on the shape of the heating mask.

13. The method according to claim 1, wherein said annealing step is performed using a laser output device positioned above the X-ray absorber.

14. A method of manufacturing an X-ray mask comprising the steps of:

forming an X-ray absorber on a substrate; and doping ions into said X-ray absorber in accordance with a specified non-uniform ion injection distribution with which a measured thin film stress at respective parts throughout the X-ray absorber can be made to be substantially zero.

15. A method of manufacturing an X-ray mask, said method comprising the steps of:

forming a first X-ray absorber layer on a substrate under a first set of manufacturing conditions; and forming a second X-ray absorber layer over the first X-ray absorber layer under a second set of manufacturing conditions so that the second X-ray absorber layer compensates for the thin film stress distribution created by the first X-ray absorber layer so that the overall thin film stress throughout the resulting X-ray absorber is substantially zero.

16. The method according to claim 15, wherein the first X-ray absorber layer is formed at a first pressure level, and the second X-ray absorber layer is formed at a second pressure level which is lower than the first pressure level to create substantially uniform stress in the thickness direction of the X-ray mask.

17. A method of manufacturing an X-ray mask, said method comprising the steps of:

forming a thin film membrane on a substrate, the thin film membrane including first regions having a substantially flat upper surface and second regions having a rough upper surface;

forming an X-ray absorber on the thin film membrane, the X-ray absorber including amorphous regions having an amorphous structure and non-amorphous regions having a non-amorphous structure.

18. The method of manufacturing an X-ray mask, said method comprising the steps of:

forming a first X-ray absorber layer on a substrate, the first X-ray absorber layer being annealed at a first temperature;

forming a second X-ray absorber layer on the first X-ray absorber layer, the second X-ray absorber being annealed at a second temperature which is lower than the first temperature; and forming a third X-ray absorber layer on the second X-ray absorber layer, the third X-ray absorber layer being formed at a third temperature which is lower than the second temperature so that the stress in the thickness direction of the X-ray mask is made to be uniform.

* * * * *